United States Patent
Ye et al.

(10) Patent No.: US 12,274,123 B2
(45) Date of Patent: Apr. 8, 2025

(54) LIGHT EMITTING DEVICE AND DISPLAY APPARATUS INCLUDING THE SAME

(71) Applicant: Samsung Display Co., Ltd., Yongin-si (KR)

(72) Inventors: Jimyoung Ye, Suwon-si (KR); Seulong Kim, Cheonan-si (KR); Hajin Song, Hwaseong-si (KR); Jihwan Yoon, Yongin-si (KR); Hyekyun Lee, Seoul (KR); Dongseob Jeong, Suwon-si (KR); Jaehoon Hwang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 430 days.

(21) Appl. No.: 17/591,091

(22) Filed: Feb. 2, 2022

(65) Prior Publication Data
US 2022/0320467 A1   Oct. 6, 2022

(30) Foreign Application Priority Data

Apr. 5, 2021   (KR) .................. 10-2021-0044185

(51) Int. Cl.
*H01L 33/00*    (2010.01)
*H10K 50/13*    (2023.01)
(Continued)

(52) U.S. Cl.
CPC ......... *H10K 50/852* (2023.02); *H10K 50/131* (2023.02); *H10K 59/38* (2023.02); *H10K 2101/27* (2023.02)

(58) Field of Classification Search
CPC .......... H01L 29/78618; H01L 27/1225; H01L 27/1248; H01L 27/1251; H01L 27/1255; H01L 27/1262; H01L 27/127; H01L 29/41733; H01L 29/78675; H01L 29/7869; H01L 27/1222; H10K 59/1213; H10K 59/12; H10K 59/1201; H10K 59/123;
(Continued)

(56) References Cited

U.S. PATENT DOCUMENTS 10,050,238 B2    8/2018  Cho et al.
10,109,685 B2   10/2018  Song et al.
(Continued)

FOREIGN PATENT DOCUMENTS

JP       2009266459 A  * 11/2009
KR    1020150142009 A    12/2015
(Continued)

*Primary Examiner* — Samuel Park
(74) *Attorney, Agent, or Firm* — CANTOR COLBURN LLP

(57) ABSTRACT

A light emitting device includes: a first electrode; a hole transport region disposed on the first electrode; a first emission layer disposed on the hole transport region, and which emits light of a first wavelength; a second emission layer disposed on the hole transport region, and which emits light of a second wavelength different from the first wavelength; an electron transport region disposed on the first emission layer and the second emission layer; a second electrode disposed on the electron transport region; and a capping layer disposed on the second electrode. In exit light emitted to an upper surface of the capping layer, the exit light has a maximum intensity at an azimuth angle of about 25° to about 35°.

20 Claims, 12 Drawing Sheets

(51) Int. Cl.
*H10K 50/852* (2023.01)
*H10K 59/38* (2023.01)
*H10K 101/00* (2023.01)

(58) Field of Classification Search
CPC .... H10K 59/131; H10K 59/40; H10K 59/873; H10K 59/124; H10K 50/852; H10K 50/131; H10K 59/38; H10K 2101/27; H10K 50/17; H10K 50/171; H10K 50/19; H10K 59/87; H10K 59/876; H10K 59/8792; H10K 2102/331; H10K 50/13; H10K 50/11; H10K 50/155; H10K 50/165; G06F 3/041
See application file for complete search history.

(56) References Cited

U.S. PATENT DOCUMENTS

| | | | |
|---|---|---|---|
| 10,134,813 B2 | 11/2018 | Choi | |
| 10,692,417 B2 | 6/2020 | Lee et al. | |
| 10,923,538 B2 | 2/2021 | Lee et al. | |
| 11,968,874 B2 | 4/2024 | Park et al. | |
| 2014/0001448 A1* | 1/2014 | Naraoka | H10K 50/856 257/40 |
| 2015/0060812 A1* | 3/2015 | Kim | H10K 59/32 257/40 |
| 2015/0108453 A1* | 4/2015 | Oh | H01L 33/44 257/40 |
| 2016/0064682 A1* | 3/2016 | Yamae | H10K 50/854 257/40 |
| 2019/0296088 A1* | 9/2019 | Kim | H10K 59/879 |
| 2020/0035760 A1 | 1/2020 | Park et al. | |
| 2020/0212130 A1* | 7/2020 | Kim | H10K 50/844 |

FOREIGN PATENT DOCUMENTS

| | | |
|---|---|---|
| KR | 1020160069468 A | 6/2016 |
| KR | 1020160070272 A | 6/2016 |
| KR | 1020170100093 A | 9/2017 |
| KR | 1020190000759 A | 1/2019 |
| KR | 1020200013499 A | 2/2020 |
| KR | 1020200082763 A | 7/2020 |
| KR | 1020200121430 A | 10/2020 |
| KR | 102200111 B1 | 1/2021 |

* cited by examiner

FIG. 8

| Classifi-cation | Organic layer thickness | Azimuth 0° - 30° ratio | Azimuth 0° CIEx | Azimuth 0° CIEy | Azimuth 30° CIEx | Azimuth 30° CIEy | Operation voltage | Front luminous efficiency | Sum of intensity for each azimuth | white light efficiency | color reproducibility |
|---|---|---|---|---|---|---|---|---|---|---|---|
| Example | d | 1:1.11 | 0.232 | 0.193 | 0.228 | 0.228 | 99% | 75% | 147% | 107% | 90.2% |
| Comparative Example 1 | d-200 | 1:0.86 | 0.228 | 0.236 | 0.219 | 0.334 | 100% | 100% | 100% | 100% | 88.6% |
| Comparative Example 2 | d-100 | 1:0.93 | 0.228 | 0.202 | 0.226 | 0.272 | 99% | 90% | 122% | 102% | 89.8% |
| Comparative Example 3 | d+100 | 1:1.21 | 0.236 | 0.198 | 0.231 | 0.208 | 99% | 64% | 172% | 103% | 89.6% |
| Comparative Example 4 | d+200 | 1:1.26 | 0.236 | 0.208 | 0.237 | 0.203 | 100% | 53% | 194% | 103% | 89.3% |

LIGHT EMITTING DEVICE AND DISPLAY APPARATUS INCLUDING THE SAME

This application claims priority to Korean Patent Application No. 10-2021-0044185, filed on Apr. 5, 2021, and all the benefits accruing therefrom under 35 U.S.C. § 119, the content of which in its entirety is herein incorporated by reference.

BACKGROUND

The present disclosure herein relates to a light emitting device and a display apparatus including the same, and more particularly, to a light emitting device having improved luminous efficiency and color reproducibility, and a display apparatus including the same.

An organic light emitting device is fast in response and a self-luminous type device driven at a low voltage. Accordingly, an organic light emitting display apparatus including the organic light emitting device may omit separate light sources to have the benefit of being reduced in weight and thickness and having excellent luminance and no viewing angle dependence.

The organic light emitting device is a display device having an emission layer formed of an organic material between an anode electrode and a cathode electrode. Holes provided from the anode electrode and electrons provided from the cathode electrode combine in the emission layer to form excitons, and then light corresponding to energy between the holes and the electrons is generated from the excitons.

A tandem organic light emitting device has a structure including two or more stacks of hole transport layer/emission light/electron transport layer between the anode electrode and the cathode electrode, and has a charge generation layer present between respective stacks to help generate and transfer charges.

SUMMARY

The present disclosure provides a light emitting device capable of improving luminous efficiency and color reproducibility when applied to a display apparatus.

The present disclosure also provides a display apparatus having improved luminous efficiency and color reproducibility.

An embodiment of the invention provides a light emitting device including: a first electrode; a hole transport region disposed on the first electrode; a first emission layer disposed on the hole transport region, and which emits light of a first wavelength; a second emission layer disposed on the hole transport region, and which emits light of a second wavelength different from the first wavelength; an electron transport region disposed on the first emission layer and the second emission layer; a second electrode disposed on the electron transport region; and a capping layer disposed on the second electrode. In exit light emitted to an upper surface of the capping layer, the exit light has a maximum intensity at an azimuth angle of about 25 degrees (°) to about 35°.

In an embodiment, the first wavelength may be about 420 nanometers (nm) to about 480 nm, and the second wavelength may be about 520 nm to about 600 nm.

In an embodiment, the light emitting device according to an embodiment of the invention may further include a first charge generation layer disposed between the first emission layer and the second emission layer.

In an embodiment, the first charge generation layer may include a first p-type charge generation layer doped with a p-dopant, and a second n-type charge generation layer doped with an n-dopant.

In an embodiment, the light emitting device according to an embodiment of the invention may further include an additional emission layer disposed between the hole transport region and the electron transport region, and which emits light of the first wavelength.

In an embodiment, the additional emission layer may include a first additional emission layer disposed between the first emission layer and the second emission layer, and a second additional emission layer disposed between the first additional emission layer and the second emission layer.

In an embodiment, the additional emission layer may include a third additional emission layer disposed between the second electrode and the second emission layer, and which emits light of the first wavelength.

In an embodiment, the second emission layer may be disposed between the first emission layer and the second electrode.

In an embodiment, the hole transport region may include a hole injection layer disposed on the first electrode, and a hole transport layer disposed on the hole injection layer, and the electron transport region may include an electron transport layer disposed on the first emission layer and the second emission layer, and an electron injection layer disposed on the electron transport layer.

In an embodiment, the capping layer may have a refractive index of about 1.6 or greater.

In an embodiment, the first emission layer may be a fluorescent emission layer, and the second emission layer may be a phosphorescent emission layer.

In an embodiment, the intensity of the exit light at an azimuth angle of 30° may be about 1.0 to about 1.2 times the intensity of the exit light at an azimuth angle of 0°.

In an embodiment, color coordinate CIEx_30 of the exit light at an azimuth angle of 30° may be about 0.210 to about 0.230, and color coordinate CIEy_30 at an azimuth angle of 30° is about 0.200 to about 0.230.

In an embodiment, color coordinate CIEx_0 of the exit light at an azimuth angle of 0° may be about 0.215 to about 0.235, and color coordinate CIEy_0 at an azimuth angle of 0° is about 0.185 to about 0.205.

In an embodiment, the light emitting device according to an embodiment of the invention may further include an intermediate electron transport layer disposed on the first emission layer, and an intermediate hole transport layer disposed on the second emission layer and the first emission layer.

In an embodiment, a distance from an upper surface of the first electrode to a lower surface of the second electrode is defined as an optical distance, and the optical distance may be about 4200 Angstroms (Å) to about 4350 Å.

In an embodiment of the invention, a light emitting device includes: a first electrode; a hole transport region disposed on the first electrode; a plurality of first emission layers disposed on the hole transport region, and which emits light of a first wavelength; a second emission layer disposed on the hole transport region, and which emits light of a second wavelength different from the first wavelength; an electron transport region disposed on the first emission layer and the second emission layer; and a second electrode disposed on the electron transport region. A distance from an upper surface of the first electrode to a lower surface of the second electrode is defined as an optical distance, and the optical distance is about 4200 Å to about 4350 Å.

In an embodiment of the invention, a display apparatus includes: a substrate in which a first pixel area which emits light of a first wavelength, a second pixel area which emits light of a second wavelength different from the first wavelength, and a third pixel area which emits light of a third wavelength different from the first wavelength and the second wavelength are defined; and a plurality of light emitting devices disposed on the substrate to overlap the first pixel area, the second pixel area, and the third pixel area in a plan view. The plurality of light emitting devices include: a first electrode; a hole transport region disposed on the first electrode; a first emission layer disposed on the hole transport region, and which emits light of a first wavelength; a second emission layer disposed on the hole transport region, and which emits light of a second wavelength different from the first wavelength; an electron transport region disposed on the first emission layer and the second emission layer; a second electrode disposed on the electron transport region; and a capping layer disposed on the second electrode. In exit light emitted to an upper surface of the capping layer, the exit light having a maximum intensity at an azimuth angle of about 25° to about 35°.

In an embodiment, the display apparatus according to an embodiment of the invention may further include a light control layer disposed on the plurality of light emitting devices. The light control layer may include: a first light control unit which overlaps the first pixel area in the plan view and transmits the light of the first wavelength; a second light control unit which overlaps the second pixel area in the plan view and transmits light of the second wavelength; and a third light control unit which overlaps the third pixel area in the plan view and transmits light of the third wavelength.

In an embodiment, the second light control unit may contain a first quantum dot which converts the exit light into the light of the second wavelength, and the third light control unit may contain a second quantum dot which converts the exit light into the light of the third wavelength.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings:

FIG. 8 is a table 1 showing evaluation results of light emitting devices and display apparatuses of Examples and Comparative Examples.

DETAILED DESCRIPTION

Figure 1:
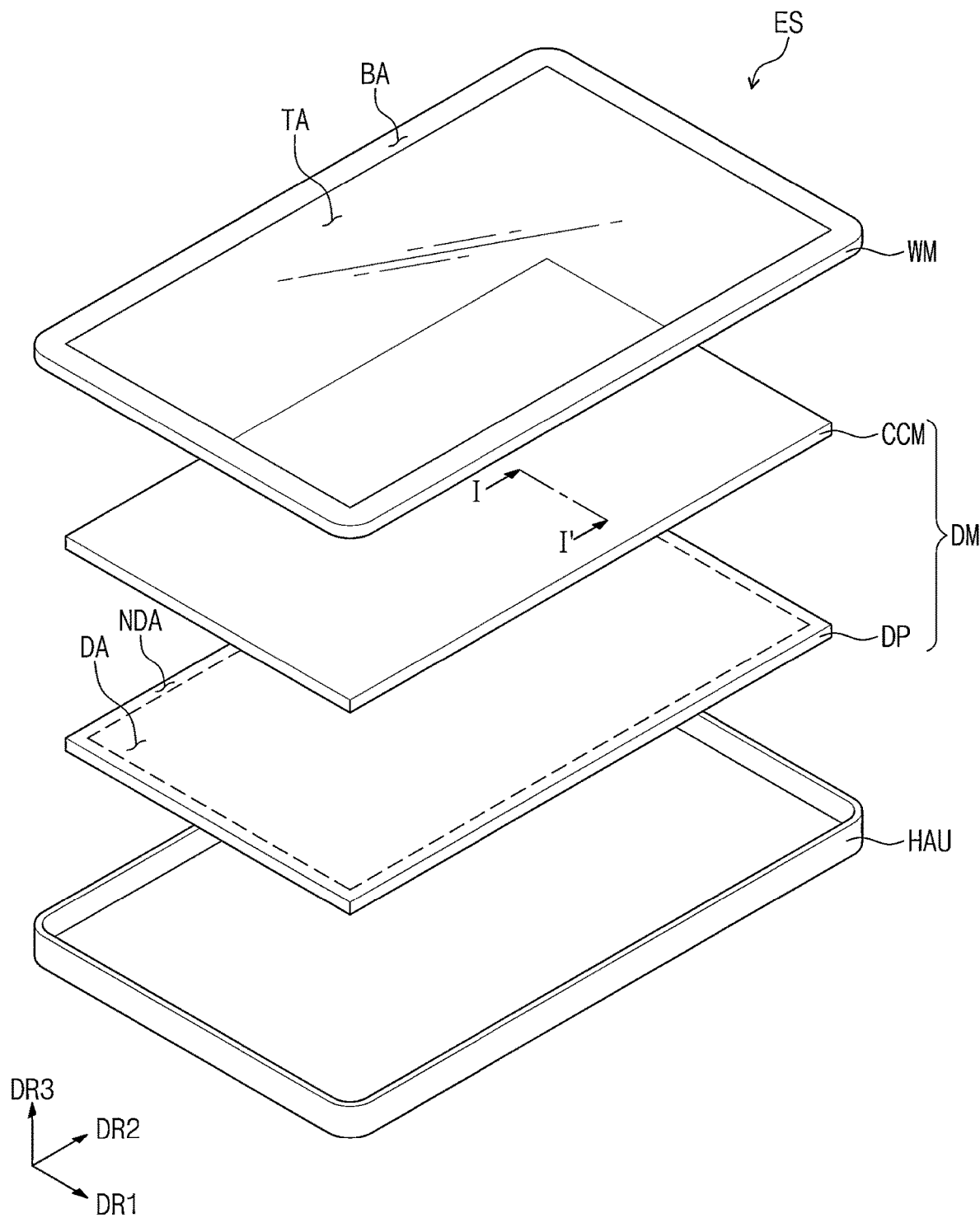
FIG. 1 is an exploded perspective view of a display apparatus according to an embodiment of the invention.

In the present description, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, a display apparatus and a light emitting device according to an embodiment of the invention will be described with reference to the accompanying drawings.

Figure 2:
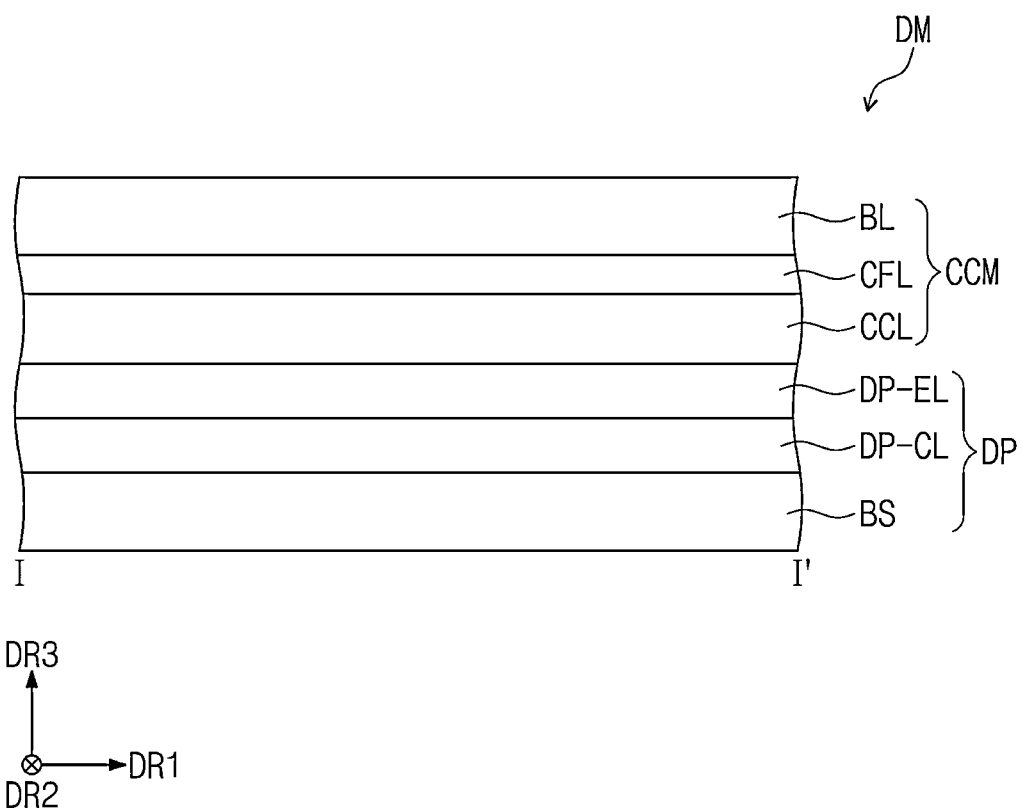
FIG. 2 is a cross-sectional view of a display module according to an embodiment of the invention.

FIG. 1 is an exploded perspective view of a display apparatus according to an embodiment of the invention. FIG. 2 is a cross-sectional view of a display module according to an embodiment of the invention. FIG. 2 is a cross-sectional view taken along line I-I' of FIG. 1.

In an embodiment, a display apparatus ES may be a large-sized electronic apparatus such as a television set, a monitor, or an outdoor billboard. In another embodiment, the display apparatus ES may be a display apparatus used in a small- and medium-sized electronic device such as a personal computer, a laptop computer, a personal digital terminal, a car navigation unit, a game console, a smartphone, a tablet, and a camera. However, these are merely presented as an example, and thus it may be adopted for other display apparatuses without departing from the invention.

The display apparatus ES of an embodiment may include a window WM, a display module DM, and a housing HAU. The display module DM may include a display panel DP. Although not shown in the drawing, the display apparatus ES may include various types of devices activated according to electrical signals, such as a display device, a touch device, or a detection device.

FIG. 1 and the following drawings show the first to third directions DR1 to DR3, and directions indicated by the first to third directions DR1, DR2, and DR3 described herein are relative concepts, and may thus be changed to other directions.

In the present description, for the convenience of description, the third direction DR3 is defined as a direction in which images are provided from the display apparatus ES to users. In addition, the first direction DR1 and the second direction DR2 may be perpendicular to each other, and the third direction DR3 may be a normal direction to a plane defined by the first direction DR1 and the second direction DR2. In FIG. 1, the plane defined by the first direction DR1 and the second direction DR2 may be a display surface on which images are provided.

In the display apparatus ES according to an embodiment, the window WM may be disposed on the display module DM. The window WM may be a material including glass, sapphire, or plastic. The window WM includes a transmission area TA that transmits images provided from the display module DM, and a light blocking area BA that is adjacent to the transmission area TA and does not transmit images. Unlike what is shown in FIG. 1, in the display apparatus ES of another embodiment, the window WM may be omitted.

In the display apparatus ES of an embodiment, the display module DM may be disposed below the window WM. The display module DM may include a display panel DP, and a light control member CCM disposed on the display panel DP.

The display panel DP may be a light emitting display panel. For example, the display panel DP may be a light emitting device ("LED") display panel, an organic electroluminescence display panel, or a quantum dot light emitting display panel. However, the embodiment of the invention is not limited thereto.

The light emitting device (LED) display panel may include a light emitting device, an emission layer of the organic electroluminescence display panel may include an organic electroluminescent material, and an emission layer of the quantum dot light emitting display panel may include quantum dots or quantum rods. Hereinafter, the display panel DP included in the display apparatus ES according to an embodiment of the invention will be described as an organic electroluminescence display panel. However, the embodiment of the invention is not limited thereto.

The display apparatus ES of an embodiment may include a display panel DP and a light control member CCM disposed on an upper side of the display panel DP, and the display apparatus ES of an embodiment may be an organic electroluminescence display apparatus including an organic electroluminescence display panel. The display panel DP may provide first light having a predetermined wavelength. For example, the display panel DP may provide blue light as the first light. However, the embodiment of the invention is not limited thereto, and the display panel DP may emit white light in another embodiment.

The light control member CCM may convert a wavelength of the first light provided from the display panel DP or transmit the first light provided from the display panel DP without such conversion. The light control member CCM may convert a wavelength of the first light provided from the display panel DP or transmit the first light.

On a plane (in a plan view, that is viewed from the third direction DR3), one surface of the display panel DP on which images are displayed is defined as a display surface. The display surface includes a display area DA in which images are displayed and a non-display area NDA in which images are not displayed. The display area DA is defined in the center of the display panel DP on a plane, and may overlap the transmission area TA of the window WM in a plan view.

The housing HAU may be disposed below the display panel DP and accommodate the display panel DP. The housing HAU may be disposed to cover the display panel DP such that an upper surface, which is the display surface of the display panel DP is exposed. The housing HAU may cover a side surface and a bottom surface of the display panel DP, and expose the whole upper surface thereof.

Referring to FIG. 2, the display panel DP may include a base substrate BS, a circuit layer DP-CL provided on the base substrate BS, and a display element layer DP-EL. In an embodiment, the base substrate BS, the circuit layer DP-CL, and the display element layer DP-EL may be sequentially stacked in the third direction DR3.

The base substrate BS may be a member providing a base surface in which the display element layer DP-EL is disposed. The base substrate BS may be a glass substrate, a metal substrate, a plastic substrate, etc. However, the embodiment of the invention is not limited thereto, and the base substrate BS may be an inorganic layer, an organic layer, or a composite material layer in another embodiment.

In an embodiment, the circuit layer DP-CL may be disposed on the base substrate BS, and the circuit layer DP-CL may include a plurality of transistors (not shown). The transistors (not shown) may each include a control electrode, an input electrode, and an output electrode. For example, the circuit layer DP-CL may include a switching transistor and a driving transistor for driving an organic electroluminescence device ED (FIG. 4A) of the display element layer DP-EL.

The light control member CCM is disposed on the display panel DP. The light control member CCM may include a light control layer CCL, a color filter layer CFL, and an upper base layer BL. For example, the display panel DP may include a light emitting device ED (FIG. 4A) which emits first light, and the light control member CCM may include the light control layer CCL (FIG. 4A) which converts wavelength of light provided from the light emitting device ED (FIG. 4A) or transmits light.

Figure 3:
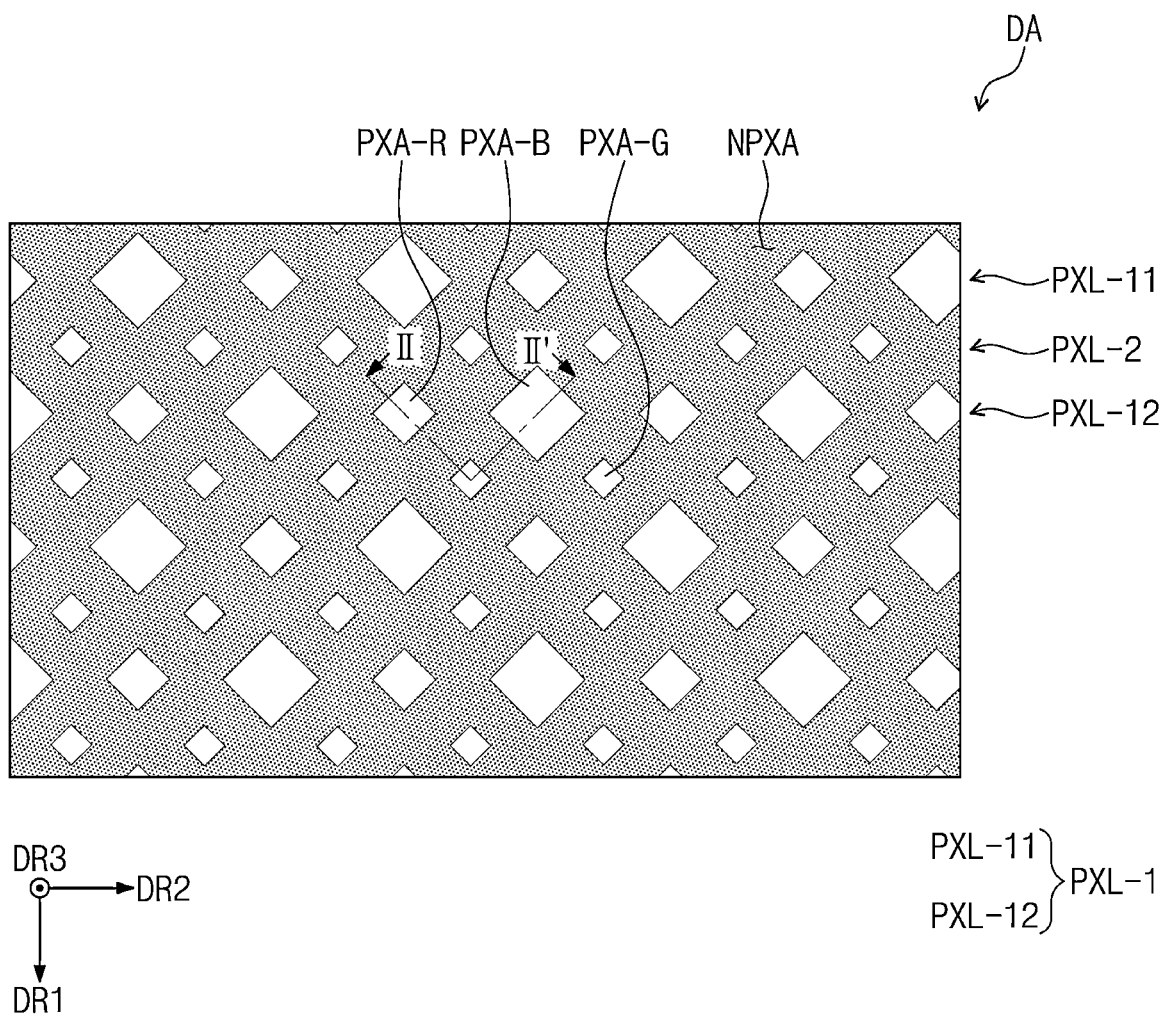
FIG. 3 is a plan view enlarging and showing a portion of a display panel included in a display apparatus according to an embodiment of the invention.
Figure 4A:
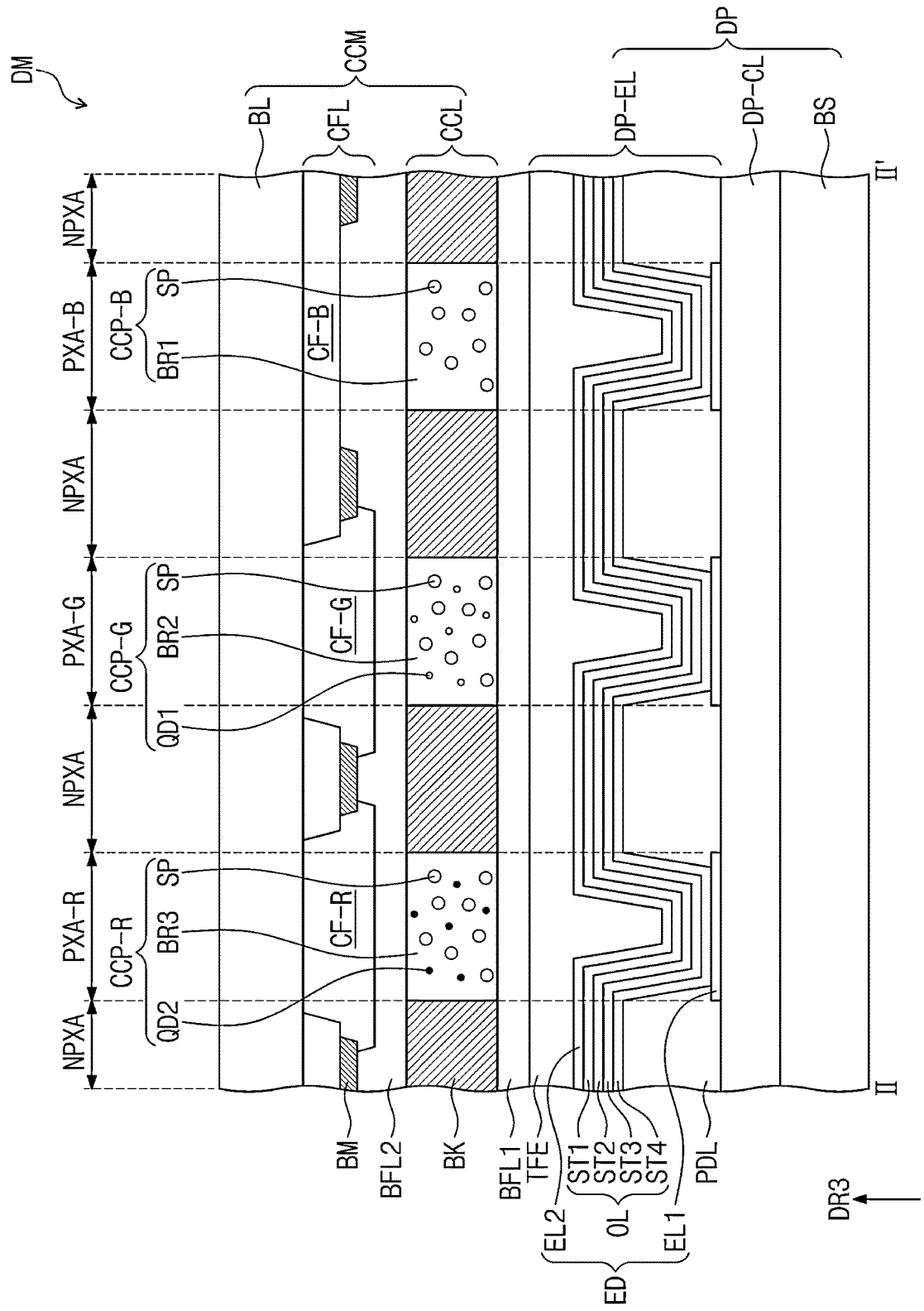
FIGS. 4A and 4B are cross-sectional views enlarging and showing a portion of a display module included in a display apparatus according to an embodiment of the invention.
Figure 4B:
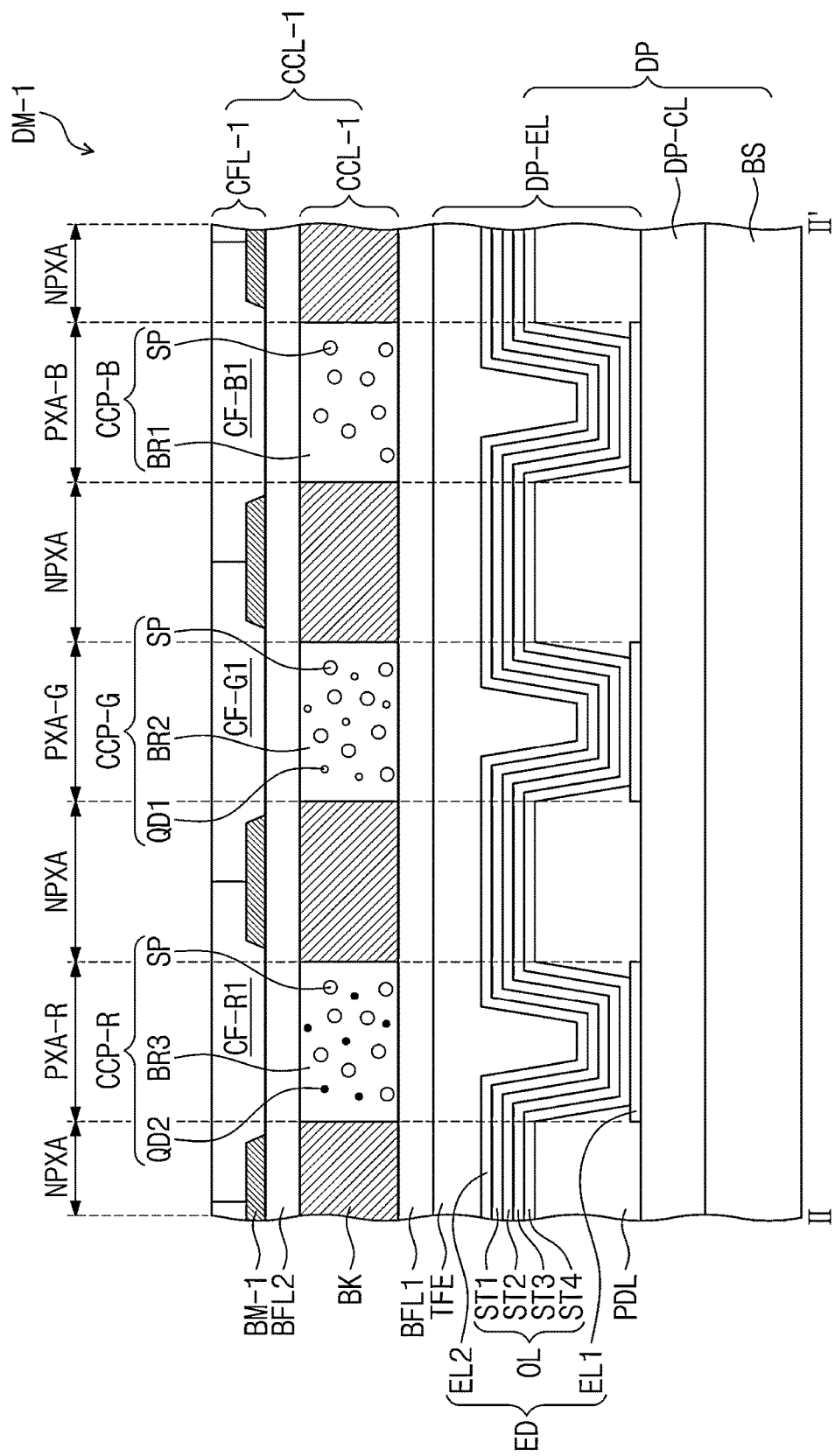

FIG. 3 is a plan view enlarging and showing a portion of a display panel included in a display apparatus according to an embodiment of the invention. FIGS. 4A and 4B are cross-sectional views enlarging and showing a portion of a display module included in a display apparatus according to an embodiment of the invention. FIG. 3 shows a portion of a display area DA of a display panel according to an embodiment of the invention. FIGS. 4A and 4B show portions taken along line II-II' of FIG. 3.

Hereinafter, display modules DM and DM-1 of an embodiment described with reference to FIGS. 3, 4A, and 4B are included in the display apparatus ES of an embodiment described in FIG. 1, and the display modules DM and DM-1 may include a display panel DP and a light control member CCM and CCM-1.

The display module DM according to an embodiment may include a display panel DP and a light control member CCM disposed on the display panel DP, and the light control member CCM may include a light control layer CCL and a color filter layer CFL. The light control member CCM may include an upper base layer BL, a light control layer CCL disposed below the upper base layer BL, and a color filter layer CFL disposed between the light control layer CCL and the upper base layer BL. In the light control member CCM, the light control layer CCL may be disposed adjacent to the display panel DP.

The light control member CCM may include a plurality of partitions BK, and light control units CCP-R, CCP-B, and CCP-G disposed between the partitions BK.

Referring to FIGS. 3, 4A, and 4B, the display module DM may include a non-pixel area NPXA and pixel areas PXA-R, PXA-B, and PXA-G. The pixel areas PXA-R, PXA-B, and PXA-G may each be an area which emits light generated from corresponding light emitting device ED. An area of each of the light emission areas PXA-R, PXA-B and PXA-G may be different in size from one another, and in this case, the area may refer to an area when viewed on a plane (i.e., in a plan view). The non-pixel area NPXA sets a boundary between the plurality of pixel areas PXA-R, PXA-B, and PXA-G, and prevents color mixing between the plurality of pixel areas PXA-R, PXA-B, and PXA-G. The plurality of pixel areas PXA-R, PXA-B, and PXA-G may define a plurality of pixel rows PXL-1 and PXL-2 extending in the second direction DR2. In FIG. 3, the second direction DR2 is defined as an extension direction (or row direction) of the pixel rows PXL-1 and PXL-2, and the first direction DR1 is defined as a column direction. The pixel areas PXA-R, PXA-B, and PXA-G may be divided into a plurality of groups according to the color of emitted light. In the display module DM of an embodiment shown in FIGS. 3, 4A, and 4B, three pixel areas PXA-R, PXA-B, and PXA-G which emit red light, blue light, and green light, respectively, are presented as an example. For example, the display apparatus ES of an embodiment (FIG. 1) may include a red pixel area PXA-R, a blue pixel area PXA-B, and a green pixel area PXA-G, which are distinct from one another. The red pixel area PXA-R emits light having a light which emits wavelength of about 620 nanometers (nm) to about 700 nm, the blue pixel area PXA-B emits light having a light which emits wavelength of about 410 nm to about 480 nm, and the green pixel area PXA-G may emit light having a light which emits wavelength of about 500 nm to about 600 nm.

An arrangement of the red pixel area PXA-R and the blue pixel area PXA-B in the first pixel row PXL-11 may be different from that in the second pixel row PXL-12. The red pixel area PXA-R of the first pixel row PXL-11 and the blue pixel area PXA-B of the second pixel row PXL-12 may be aligned along the first direction DR1, and the blue pixel area PXA-B of the first pixel row PXL-11 and the red pixel area PXA-R of the second pixel row PXL-12 may be aligned along the first direction DR1.

The second group of pixel rows PXL-2 may include green pixel areas PXA-G.

The first group of pixel rows PXL-1 and the second group of pixel rows PXL-2 may be alternately disposed along the first direction DR1. The second group of pixel rows PXL-2 may be disposed between the first pixel rows PXL-11 and second pixel rows PXL-12 which are successively placed, and one of the first pixel row PXL-11 and the second pixel row PXL-12 may be disposed between adjacent second group of pixel rows PXL-2.

In the display modules DM and DM-1 according to an embodiment shown in FIGS. 4A and 4B, the display panel DP is shown to include a light emitting device ED including an organic layer OL as a common layer. That is, in the display module DM and DM-1 according to an embodiment shown in FIGS. 4A and 4B, the display panel DP may emit the same light regardless of the pixel areas PXA-R, PXA-B, and PXA-G of the display module DM. For example, the display panel DP may provide blue light, which is first light, to the light control member CCM. In addition, the display panel DP may provide white light as first light, to the light control member CCM.

In the display module DM and DM-1 according to an embodiment shown in FIGS. 3, 4A, and 4B, the red pixel area PXA-R among the pixel areas PXA-R, PXA-B, and PXA-G may have a larger area than the green pixel area PXA-G, and the blue pixel area PXA-B may have a larger area than each of the red pixel area PXA-R and the green pixel area PXA-G. However, the embodiment of the invention is not limited thereto, and the pixel areas PXA-R, PXA-B, and PXA-G may have the same size of area, or may have different size of area according to the color emitted from the light control units CCP-R, CCP-B, and CCP-G in another embodiment. For example, in the display modules DM and DM-1 according to an embodiment, the blue pixel area PXA-B may have the largest area, and the green pixel area PXA-G may have the smallest area. Alternatively, in the display modules DM and DM-1, the green pixel area PXA-G may have the largest area, the red pixel area PXA-R may be smaller than the green pixel area PXA-G, and larger than the blue pixel area PXA-B, and the blue pixel area PXA-B may have the smallest area. However, the embodiment is not limited thereto, and the pixel areas PXA-R, PXA-B, and PXA-G emit light of a color other than red light, blue light, and green light, or the pixel areas PXA-R, PXA-B, and PXA-G may be provided to have different area ratios.

Each of the pixel areas PXA-R, PXA-B, and PXA-G may be an area separated by the pixel defining films PDL. The non-pixel areas NPXA may be areas between neighboring pixel areas PXA-R, PXA-B, and PXA-G, and may correspond to the pixel defining films PDL.

As shown in FIG. 3, among the pixel areas PXA-R, PXA-B, and PXA-G, the red pixel area PXA-R and the green pixel area PXA-G may be symmetrical with a reference axis extending in the second direction DR2 as a center, and the blue pixel area PXA-B may be disposed between the red pixel area PXA-R and the green pixel area PXA-G. When viewed in the first direction DR1, a portion of the blue pixel area PXA-B may not overlap the red pixel area PXA-R and the green pixel area PXA-G in a plan view. However, the embodiment of the invention is not limited thereto, and the pixel areas PXA-R, PXA-B, and PXA-G may have various shapes of polygons or circles, and an arrangement structure of the pixel areas is also not limited. For example, in an embodiment, the pixel areas PXA-B, PXA-G and PXA-R may have a stripe structure in which the blue pixel area PXA-B, the green pixel area PXA-G, and the red pixel area PXA-R may be alternately arranged, and the arrangement structure of the pixel areas PXA-R, PXA-B and PXA-G 4 may be a pantile structure.

Referring to FIGS. 4A and 4B, the display panel DP according to an embodiment includes a base substrate BS, a circuit layer DP-CL disposed on the base substrate BS, and a display element layer DP-EL disposed on the circuit layer DP-CL. The display element layer DP-EL may include pixel defining films PDL, a light emitting device ED disposed between the pixel defining films PDL, and a thin film encapsulation layer TFE disposed on the light emitting device ED.

The pixel defining films PDL may include or be formed of a polymer resin. For example, the pixel defining films PDL may include or be formed including a polyacrylate-based resin or a polyimide-based resin. In addition, the pixel defining films PDL may be formed by further including an inorganic material in addition to the polymer resin. The pixel defining films PDL may be formed including a light absorbing material, or may be formed including a black pigment or a black dye. In addition, the pixel defining films PDL may include or be formed of an inorganic material. For example, the pixel defining films PDL may be formed including silicon nitride ($SiN_x$), silicon oxide ($SiO_x$), silicon oxide ($SiO_xN_y$), etc. The pixel defining films PDL may define the pixel areas PXA-R, PXA-B, and PXA-G. The pixel areas PXA-R, PXA-B, and PXA-G, and the non-pixel area NPXA may be separated by the pixel defining films PDL.

The pixel defining films PDL may overlap the partitions BK in a plan view. That is, each of the plurality of pixel defining films PDL may overlap and correspond to each of the plurality of partitions BK in a plan view.

The light emitting device ED may include a first electrode EL1 and a second electrode EL2 which face each other, and a plurality of organic layers OL disposed between the first electrode EL1 and the second electrode EL2. The organic layers OL of the light emitting device ED may include a plurality of stacks ST1, ST2, ST3, and ST4. The plurality of stacks ST1, ST2, ST3, and ST4 may each include functional layers including a hole transport material and an electron transport material, and an emission layer including a light emitting material. That is, the light emitting device ED included in the display module DM of an embodiment may be a light emitting device having a tandem structure including a plurality of emission layers. Hereinafter, descriptions of respective functional layers and emission layers included in the light emitting device ED will be described later.

FIGS. 4A and 4B show an embodiment in which each of the plurality of stacks ST1, ST2, ST3, and ST4 included in the organic layers OL are provided as a common layer throughout the pixel areas PXA-R, PXA-B, and PXA-G, and the non-pixel area NPXA. That is, a portion of each of the plurality of stacks ST1, ST2, ST3, and ST4 included in the light emitting device ED may be disposed on the pixel defining films PDL, and portions of the plurality of stacks ST1, ST2, ST3, and ST4 disposed in the pixel areas PXA-R, PXA-B, and PXA-G may be connected to each other on the pixel defining films PDL to form common layers having a single-body shape. Accordingly, each of the functional layers and the emission layers disposed in the plurality of stacks ST1, ST2, ST3, and ST4 may also form common layers having a single-body shape throughout the pixel areas PXA-R, PXA-B, and PXA-G, and the non-pixel area NPXA. However, the embodiment of the invention is not limited thereto, and unlike what is shown in FIGS. 4A and 4B, in another embodiment, at least a portion of the plurality of stacks ST1, ST2, ST3, and ST4 may be provided by being patterned inside openings defined in the pixel defining films PDL. At least a portion of the plurality of stacks ST1, ST2, ST3, and ST4, or at least a portion of the functional layers and emission layers included in the plurality of stacks ST1, ST2, ST3, and ST4 may be patterned through an inkjet printing method, and provided inside the openings of the pixel defining films PDL defined to overlap the pixel areas PXA-R, PXA-B, and PXA-G in a plan view.

The thin film encapsulation layer TFE may be disposed on the light emitting device ED, and the thin film encapsulation layer TFE may be disposed on the second electrode EL2. The thin film encapsulation layer TFE may be directly disposed on the second electrode EL2. The thin film encapsulation layer TFE may be a single layer or a laminated layer of a plurality of layers. The thin film encapsulation layer TFE includes at least one insulating layer. The thin film encapsulation layer TFE according to an embodiment may include at least one inorganic film (hereinafter, an encapsulation inorganic film). In addition, the thin film encapsulation layer TFE according to an embodiment may include at least one organic film (hereinafter, an encapsulation organic film) and at least one encapsulation inorganic film.

The encapsulation inorganic film protects the light emitting device ED from moisture/oxygen, and the encapsulation organic film protects the light emitting device ED from foreign substances such as dust particles. The encapsulation inorganic film may include silicon nitride, silicon oxy nitride, silicon oxide, titanium oxide, aluminum oxide, etc., but what the encapsulation inorganic film according to the invention includes is not particularly limited thereto. The encapsulation organic layer may include an acrylic compound, an epoxy-based compound, etc. The encapsulation organic layer may include a photopolymerizable organic material, and is not particularly limited.

Referring to FIG. 4A, a display device according to an embodiment includes a light control member CCM disposed on a display panel DP. The light control member CCM includes an upper base layer BL, and a light control layer CCL disposed below the upper base layer BL. The light control layer CCL may include a plurality of partitions BK disposed spaced apart from each other and a plurality of light control units CCP-R, CCP-B, and CCP-G disposed between the partitions BK. That is, the light control member CCM according to an embodiment may include an upper base layer BL, a plurality of partitions BK disposed on the upper base layer BL, and light control units CCP-R, CCP-B, and CCP-G disposed between the plurality of partitions BK spaced apart from each other. FIG. 4A shows, as an example, that the upper base layer BL providing a reference surface on which the light control layer CCL is disposed is separately provided, but the embodiment of the invention is not limited thereto, and the light control layer CCL may be disposed on the reference surface provided by the thin film encapsulation layer TFE of the display element layer DP-EL.

The light control member CCM of an embodiment may include a plurality of light control units CCP-R, CCP-B, and CCP-G. The light control units CCP-R, CCP-B, and CCP-G may include a first light control unit CCP-B which transmits light of a first wavelength, a second light control unit CCP-G which transmits light of a second wavelength, and a third light control unit CCP-R which transmits light of a third wavelength. The light of the second wavelength may be light of a longer wavelength range than the light of the first wavelength, and the light of the third wavelength may be light of a longer wavelength range than each of the light of the first wavelength and the light of the second wavelength. For example, the light of the first wavelength may be blue light, the light of the second wavelength may be green light, and the light of the third wavelength may be red light. The light of the first wavelength may be light having a light emitting wavelength of about 410 nm to about 480 nm, the light of the second wavelength may be light having a light emitting wavelength of about 500 nm to about 600 nm, and the light of the third wavelength may be light having a light emitting wavelength of about 620 nm to about 700 nm. The light of the first wavelength may be source light provided from the display panel DP to the light control layer CCL.

The second light control unit CCP-G and the third light control unit CCP-R may each include light emitting bodies. The light emitting bodies may be particles which converts the wavelength of incident light to light of a different wavelength. In an embodiment, the light emitting bodies included in the second light control unit CCP-G and the third light control unit CCP-R may be quantum dots or phosphors. The second light control unit CCP-G may include a first quantum dot QD1 which converts light emitted from the light emitting device ED into light of the second wavelength, and the third light control unit CCP-R may include a second quantum dot QD2 which converts light emitted from the light emitting device ED into light having the third wavelength. The first light control unit CCP-B may not include light emitting bodies such as quantum dots. The first light control unit CCP-B may be a transmission unit which transmits the wavelength of the first light with no conversion of wavelength. However, the embodiment of the invention is not limited thereto, and the first light control unit CCP-B may include light emitting bodies such as quantum dots which converts light emitted from the light emitting device ED into light of the first wavelength in another embodiment.

The quantum dots may be particles which converts the wavelength of provided light. The core of the quantum dots may be selected from a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may include a binary compound such as $In_2S_3$ and $In_2Se_3$, a ternary compound such as $InGaS_3$ and $InGaSe_3$, or any combination thereof.

The Group compound may include a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, or any mixture thereof, or a quaternary compound such as $AgInGaS_2$ and $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. The Group III-V compound may further include a Group II metal. For example, InZnP, etc. may be selected as a Group III-II-V compound.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, a binary compound, a ternary compound, or a quaternary compound may be present in particles in a uniform concentration distribution, or may be present in the same particles in a partially different concentration distribution. In addition, a core/shell structure in which one quantum dot surrounds another quantum dot may be present. An interface between the core and the shell may have a concentration gradient in which the concentration of an element present in the shell becomes lower towards the center.

In some embodiments, a quantum dot may have the core/shell structure including a core having nano-crystals, and a shell surrounding the core, which are described above. The shell of the quantum dot may serve as a protection layer to prevent the chemical deformation of the core so as to keep semiconductor properties, and/or a charging layer to impart electrophoresis properties to the quantum dot. The shell may be a single layer or multiple layers. An interface between the core and the shell may have a concentration gradient in which the concentration of an element present in the shell becomes lower towards the center. Examples of the shell of the quantum dot may be a metal or non-metal oxide, a semiconductor compound, or a combination thereof.

In an embodiment, for example, the metal or non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$, but the embodiment of the invention is not limited thereto.

In addition, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the embodiment of the invention is not limited thereto.

A quantum dot may have a full width of half maximum ("FWHM") of a light which emits wavelength spectrum of about 45 nm or less, preferably about 40 nm or less, more preferably about 30 nm or less, and color purity or color reproducibility may be enhanced in the above ranges. In addition, light emitted through such a quantum dot is emitted in all directions, and thus a wide viewing angle may be improved.

In addition, the form of a quantum dot is not particularly limited as long as it is a form commonly used in the art. More specifically, a quantum dot in the form of spherical, pyramidal, multi-arm, or cubic nanoparticles, nanotubes, nanowires, nanofibers, nanoplatelets, etc. may be used.

The quantum dot may control the color of emitted light according to particle size thereof, and thus the quantum dot may have various colors of emitted light such as blue, red, green, etc. The smaller the particle size of the quantum dot becomes, light in the short wavelength region may be emitted. For example, the particle size of the quantum dot which emits green light may be smaller than the particle size of the quantum dot which emits red light, and the particle size of the quantum dot which emits blue light may be smaller than the particle size of the quantum dot which emits green light.

Each of the plurality of light control units CCP-R, CCP-B, and CCP-G included in the light control layer CCL may further include scatterers SP. The first light control unit CCP-B may include the scatterers SP, the second light control unit CCP-G may include a first quantum dot QD1 and the scatterers SP, and the third light control unit CCP-R may include a second quantum dot QD2 and the scatterers SP. However, the embodiment of the invention is not limited thereto, and the first light control unit CCP-B may include the scatterers SP and quantum dots.

The scatterers SP may be inorganic particles. For example, the scatterers SP may include at least one among $TiO_2$, ZnO, $Al_2O_3$, $SiO_2$, and hollow silica. The scatterers SP may include any one among $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

The first light control unit CCP-B, the second light control unit CCP-G, and the third light control unit CCP-R may each include base resins BR1, BR2, and BR3 for dispersing the quantum dots QD1 and QD2 and the scatterer SP. In an embodiment, the first light control unit CCP-B may include the scatterers SP dispersed in the first base resin BR1, the second light control unit CCP-G may include the first quantum dot QD1 and the scatterers SP dispersed in the second base resin BR2, and the third light control unit CCP-R may include the second quantum dot QD2 and the scatterers SP dispersed in the third base resin BR3. The base resins BR1, BR2, and BR3 are a medium in which the quantum dots QD1 and QD2 and the scatterers SP are dispersed, and may include or be formed of various resin compositions, which may be generally referred to as a binder. For example, the base resins BR1, BR2, and BR3 may be an acrylic resin, a urethane-based resin, a silicone-based resin, an epoxy-based resin, etc. The base resins BR1, BR2, and BR3 may be a transparent resin. In an embodiment, the first base resin BR1, the second base resin BR2, and the third base resin BR3 may each be the same as or different from each other.

The partitions BK may define openings separating each of the pixel areas PXA-R, PXA-B, and PXA-G overlapping the light control layer CCL in a plan view. The light control units CCP-R, CCP-B, and CCP-G may fill the openings defined in the partitions BK. The partition BK may be formed including a light absorbing material, or may be formed including a black pigment or a black dye. Although not shown, a plurality of non-pixel area openings overlapping the non-pixel area NPXA in a plan view may be additionally defined in the partitions BK in addition to the openings separating each of the pixel areas PXA-R, PXA-B, and PXA-G. The light control member CCM according to an embodiment may further include a color filter layer CFL. The color filter layer CFL may be disposed between the upper base layer BL and the light control layer CCL. The color filter layer CFL may include a light blocking unit BM and filters CF-B, CF-G, and CF-R. The color filter layer CFL may include a first filter CF-B which transmits blue light, a second filter CF-G which transmits green light, and a third filter CF-R which transmits red light. For example, the first filter CF-B may be a blue filter, the second filter CF-G may be a green filter, and the third filter CF-R may be a red filter. Each of the filters CF-B, CF-G, and CF-R may include a polymer photosensitive resin and a pigment or a dye. The first filter CF-B may include a blue pigment or a blue dye, the second filter CF-G may include a green pigment or a green dye, and the third filter CF-R may include a red pigment or a red dye. The embodiment of the invention is not limited thereto, and the first filter CF-B may not include a pigment or a dye. The first filter CF-B may include a polymer photosensitive resin, but not include a pigment or a dye. The first filter CF-B may be transparent. The first filter CF-B may include or be formed of a transparent photosensitive resin.

In addition, in an embodiment, the second filter CF-G and the third filter CF-R may be yellow filters. The second filter CF-G and the third filter CF-R may not be separated from each other and may be provided as a single body.

The light blocking unit BM may be a black matrix. The light blocking unit BM may be formed including an organic light blocking material or an inorganic light blocking material, both including a black pigment or a black dye. The light blocking unit BM may prevent light leakage, and separate boundaries between the adjacent filters CF-B, CF-G, and CF-R. In addition, in an embodiment, the light blocking unit BM may include or be formed of a blue filter. Each of the plurality of light blocking unit BM may overlap and correspond to each of the plurality of partitions BK. Although not shown, the light blocking unit BM may be formed by stacking at least one of the first filter CF-B, the second filter CF-G, and the third filter CF-R. For example, the light blocking unit BM may be formed by stacking all of the first filter CF-B, the second filter CF-G, and the third filter CF-R. When the light blocking unit BM is formed of the first filter CF-B, the second filter CF-G, and the third filter CF-R, the first filter CF-B, the stacking order of the first filter CF-B, the second filter CF-G, and the third filter CF-R is not limited.

Each of the first to third filters CF-B, CF-G and CF-R may be disposed correspondingly to each of the blue pixel area PXA-B, green pixel area PXA-G, and red pixel area PXA-R.

The upper base layer BL may be disposed on the color filter layer CFL. The upper base layer BL may be a member providing a base surface on which the color filter layer CFL and the light control layer CCL are disposed. The upper base layer BL may be a glass substrate, a metal substrate, a plastic substrate, etc. However, the embodiment of the invention is not limited thereto, and the upper base layer BL may be an inorganic layer, an organic layer, or a composite material layer. In addition, unlike what is shown, the upper base layer BL may be omitted in an embodiment.

Although not shown, the color filter layer CFL may further include a low refractive index layer. The low refractive layer may be disposed between the filters CF-B, CF-G, and CF-R and the light control layer CCL. The low refractive layer may have a refractive index of about 1.1 to about 1.5. The refractive index value of the low refractive layer may be controlled by the ratio of hollow inorganic particles and/or voids included in the low refractive layer.

Although not shown, the display module DM may further include an anti-reflection layer disposed above or below the color filter layer CFL and blocking external light incident to the display module DM. The anti-reflection layer may block a part of external light. The anti-reflection layer may reduce reflected light generated in the display panel DP due to external light. The anti-reflection layer, for example, may be a polarizing layer. In an embodiment, the display module DM may include a polarizing layer disposed below the upper base layer BL, and the color filter layer CFL may be omitted.

The light control member CCM may further include buffer layers BFL1 and BFL2 blocking moisture and oxygen, and protecting components disposed on the upper and lower portions. The buffer layers BFL1 and BFL2 may include a first buffer layer BFL1 and a second buffer layer BFL2. The first buffer layer BFL1 may be disposed between the thin film encapsulation layer TFE and the light control layer CCL. The second buffer layer BFL2 may be disposed between the light control layer CCL and the color filter layer CFL.

The first buffer layer BFL1 may serve to prevent moisture and/or oxygen (hereinafter referred to as "moisture/oxygen") from being introduced into the light control layer CCL. The first buffer layer BFL1 may be disposed below the light control layer CCL to prevent the light control units CCP-B, CCP-G, and CCP-R from being exposed to moisture/oxygen. The first buffer layer BFL may include at least one inorganic layer. That is, the first buffer layer BFL1 may be include or formed of an inorganic material. For example, the first buffer layer BFL1 may be formed including silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin film in which light transmittance is secured, etc. The first buffer layer BFL1 may further include an organic film. The first buffer layer BFL1 may be formed of a single layer or a plurality of layers.

The second buffer layer BFL2 may be a protection layer protecting the light control layer CCL and the color filter layer CFL. The second buffer layer BFL2 may be an inorganic material layer including at least one inorganic material among silicon nitride, silicon oxide, and silicon oxynitride. The second buffer layer BFL2 may be formed of a single layer or a plurality of layers.

Referring to FIG. 4B, the display module DM-1 according to an embodiment may include a display panel DP and a light control member CCM-1 disposed on the display panel DP, and the light control member CCM-1 may include a light control layer CCL-1 and a color filter layer CFL-1. In the display module DM-1 according to an embodiment, the light control layer CCL-1 may be disposed on the display panel DP. The light control layer CCL-1 may be disposed on the display panel DP with the first buffer layer BFL1 therebetween.

The light control layer CCL-1 of the light control member CCM-1 may include a plurality of partitions BK and light control units CCP-R, CCP-B, and CCP-G disposed between the partitions BK. The color filter layer CFL-1 may include a light blocking unit BM-1 and filters CF-R1, CF-B1, and CF-G1.

Compared to the display module DM shown in FIG. 4A, the display module DM-1 according to an embodiment shown in FIG. 4B is an embodiment in which the upper base layer BL is omitted, and the light control layer CCL-1 and the color filter layer CFL-1 are disposed using the upper surface of the thin film encapsulation layer TFE as the base surface. That is, the light control units CCP-R, CCP-B, and CCP-G of the light control layer CCL-1 are formed in a continuous process on the display panel DP, and the filters CF-R1, CF-B1, and CF-G1 of the color filter layer CFL-1 may be sequentially formed on the light control layer CCL-1 through a continuous process.

Although not shown, the color filter layer CFL-1 may further include a low refractive index layer. Portions of the light blocking unit BM-1 and the filter units CF-R1, CF-B1, and CF-G1 included in the color filter layer CFL-1 may be omitted. The light control member CCM-1 may further include buffer layers BFL1 and BFL2 blocking moisture and oxygen, and protecting components disposed on the upper and lower portions. The buffer layers BFL1 and BFL2 may include a first buffer layer BFL1 disposed between the thin film encapsulation layer TFE and the light control layer CCL, and a second buffer layer BFL2 disposed between the light control layer CCL and the color filter layer CFL.

Figure 5A:
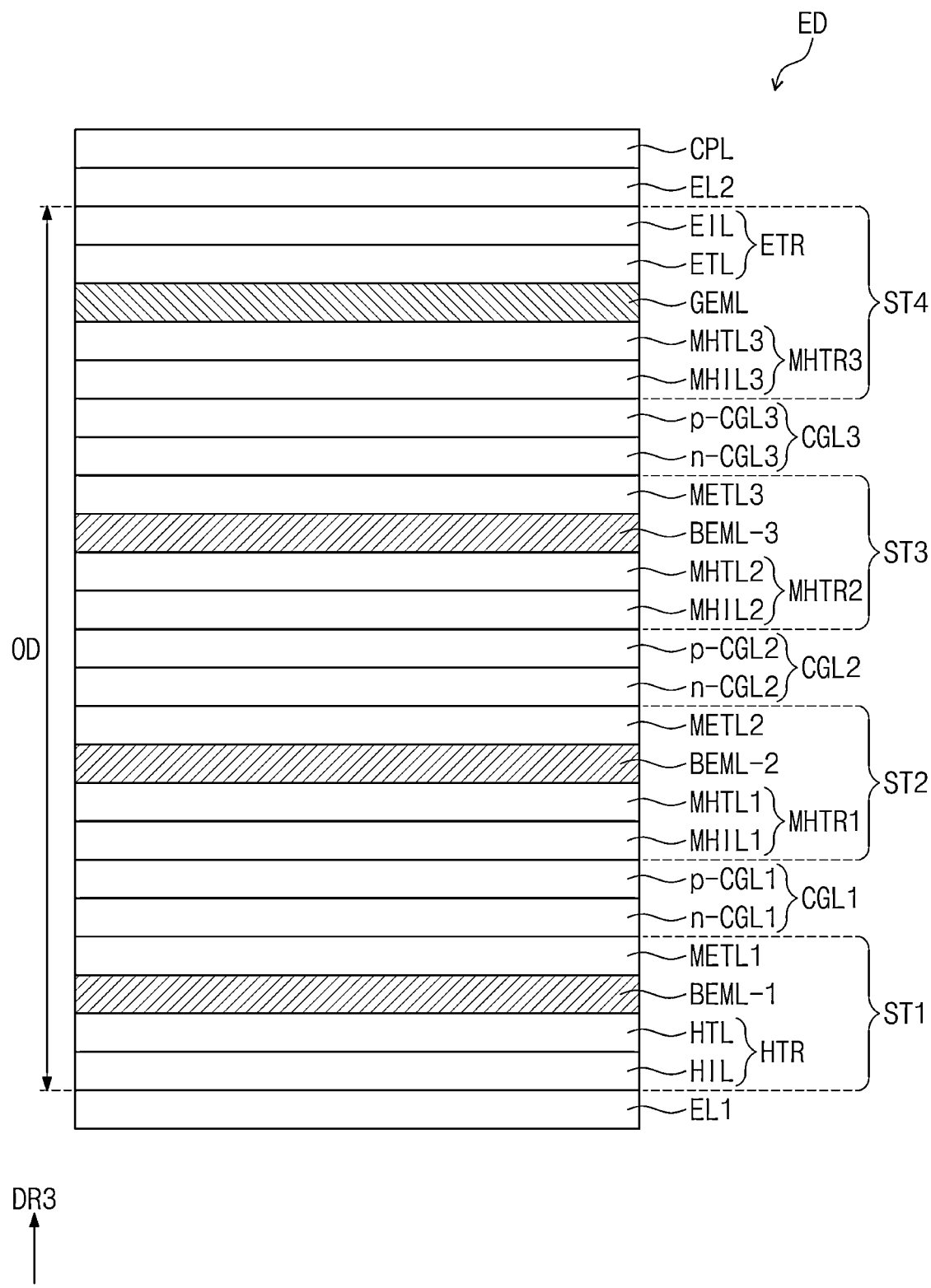
FIGS. 5A to 5C are schematic cross-sectional views of a light emitting device according to an embodiment of the invention.
Figure 5B:
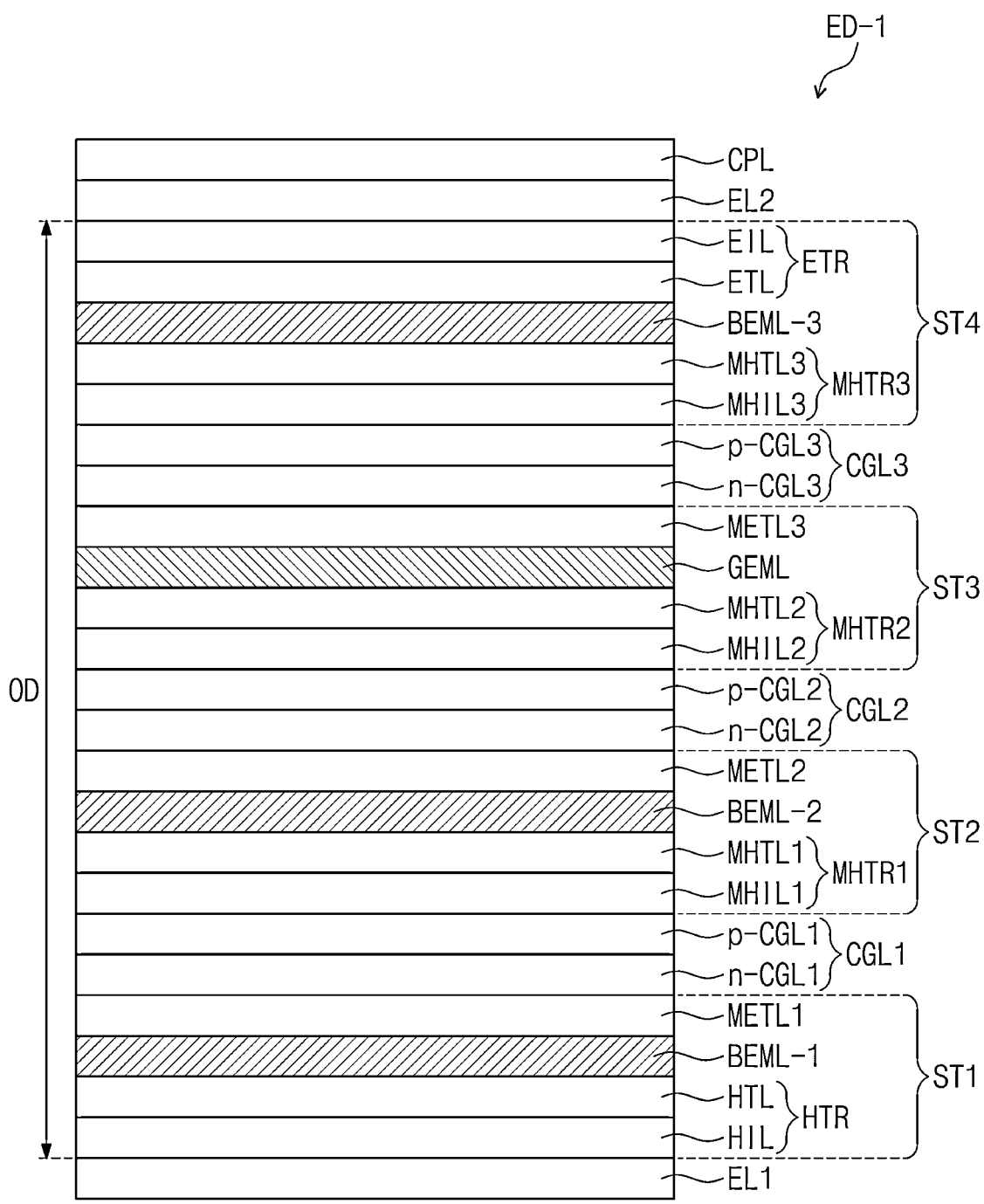
Figure 5C:
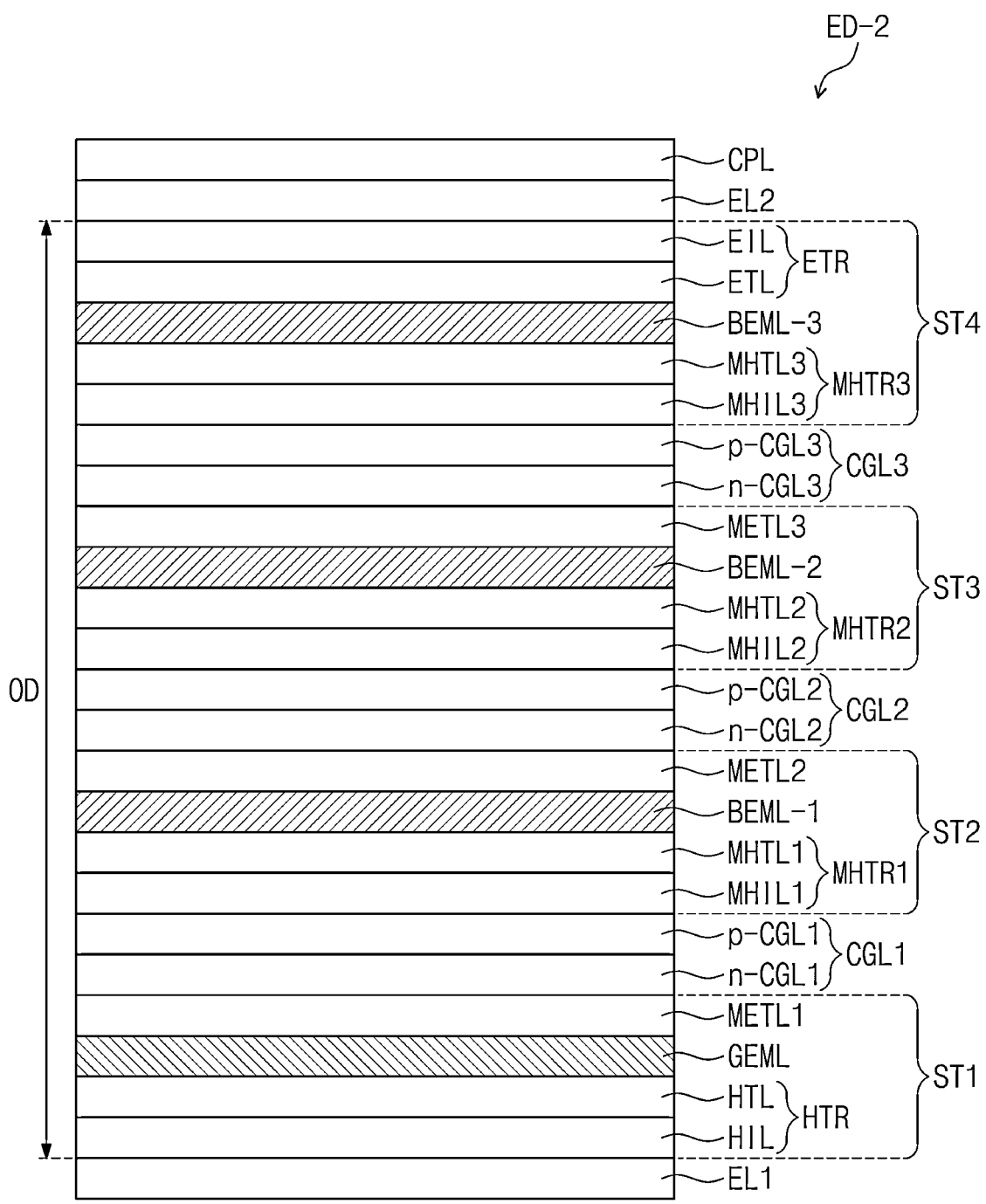

FIGS. 5A to 5C are schematic cross-sectional views of a light emitting device according to an embodiment of the invention. Hereinafter, light emitting devices ED, ED-1, and ED-2 according to an embodiment of the invention will be described with reference to FIGS. 5A to 5C.

Referring to FIG. 5A, the light emitting device ED according to an embodiment includes a first electrode EL1, a second electrode EL2 facing the first electrode EL1, and a plurality of stacks ST1, ST2, ST3, and ST4 disposed between the first electrode EL1 and the second electrode EL2. The plurality of stacks ST1, ST2, ST3, and ST4 may include a first stack ST1, a second stack ST2, a third stack ST3, and a fourth stack ST4. The first stack ST1, the second stack ST2, the third stack ST3, and the fourth stack ST4 may each include an emission layer. FIG. 5A shows that the light emitting device ED includes a total of four stacks ST1, ST2, ST3, and ST4, but the embodiment of the invention is not limited thereto, and the light emitting device ED may include 2, 3, or 5 stacks. For example, in the structure of the light emitting device ED shown in FIG. 5A, the second stack ST2 and the third stack ST3 may be omitted, and a light emitting device structure having two stacks of the first stack ST1 and the fourth stack ST4 may be provided.

In the light emitting device ED of an embodiment, a hole transport region HTR may be disposed between the first electrode EL1 and the plurality of stacks ST1, ST2, ST3, and ST4. An electron transport region ETR may be disposed between the second electrode EL2 and the plurality of stacks ST1, ST2, ST3, and ST4. In an embodiment, the light emitting device ED may emit light from the first electrode EL1 to the second electrode EL2. In the light emitting device ED of an embodiment, with respect to a direction in which light is emitted, a structure in which the hole transport region HTR is disposed below the plurality of stacks ST1, ST2, ST3, and ST4, and the electron transport region ETR is disposed above the stacks ST1, ST2, ST3, and ST4 is shown as an example. However, the embodiment of the invention is not limited thereto, and the light emitting device ED of an embodiment, with respect to a direction in which light is emitted, may have an inverted device structure in which the electron transport region ETR is disposed below the plurality of stacks ST1, ST2, ST3, and ST4, and the hole transport region HTR is disposed above the plurality of stacks ST1, ST2, ST3, and ST4.

The light emitting device ED according to an embodiment may include charge generation layers CGL1, CGL2, and CGL3 disposed between the plurality of stacks ST1, ST2, ST3, and ST4. The light emitting device ED according to an embodiment may include a first charge generation layer CGL1 disposed between the first stack ST1 and the second stack ST2, a second charge generation layer CGL2 disposed between the second stack ST2 and the third stack ST3, and a third charge generation layer CGL3 disposed between the third stack ST3 and the fourth stack ST4.

When voltages are applied to the charge generation layers CGL1, CGL2, and CGL3, a complex is formed through an oxidation-reduction reaction to generate charges (electrons and holes). In addition, the charge generation layers CGL1, CGL2, and CGL3 may provide the generated charges to the adjacent stacks ST1, ST2, ST3, and ST4, respectively. The charge generation layers CGL1, CGL2, and CGL3 may serve to double the efficiency of current generated in each of the adjacent stacks ST1, ST2, ST3, and ST4, and adjust the balance of charges between adjacent stacks ST1, ST2, ST3, and ST4.

The charge generation layers CGL1, CGL2, and CGL3 may each have a layer structure in which n-type charge generation layers n-CGL1, n-CGL2, and n-CGL3, and p-type charge generation layers p-CGL1, p-CGL2, and p-CGL3 are bonded to each other. The first charge generation layer CGL1 may have a layer structure in which a first n-type generation layer n-CGL1 and a first p-type generation layer p-CGL1 are bonded to each other. The second charge generation layer CGL2 may have a layer structure in which a second n-type generation layer n-CGL2 and a second p-type generation layer p-CGL2 are bonded to each other. The third charge generation layer CGL3 may have a layer structure in which a third n-type generation layer n-CGL3 and a third p-type generation layer p-CGL3 are bonded to each other.

The n-type charge generation layers n-CGL1, n-CGL2, and n-CGL3 may be charge generation layers providing electrons to adjacent stacks. The n-type charge generation layers n-CGL1, n-CGL2, and n-CGL3 may be layers in which base materials are doped with n-dopants. The p-type charge generation layers p-CGL1, p-CGL2, and p-CGL3 may be charge generation layers providing holes to adjacent stacks. Although not shown, a buffer layer may be further disposed between the n-type charge generation layers n-CGL1, n-CGL2, and n-CGL3, and the p-type charge generation layers p-CGL1, p-CGL2, and p-CGL3.

The charge generation layers CGL1, CGL2, and CGL3 may each include an n-type arylamine-based material or a p-type metal oxide. For example, the charge generation layers CGL1, CGL2, and CGL3 may each include an arylamine-based organic compound, a metal, a metal oxide, a carbide, a fluoride, or a charge generation compound composed of a mixture thereof.

In an embodiment, for example, the aryl amine-based organic compound may be α-NPD, 2-TNATA, TDATA, MTDATA, sprio-TAD, or sprio-NPB. For example, the metal may be cesium (Cs), molybdenum (Mo), vanadium (V), titanium (Ti), tungsten (W), barium (Ba), or lithium (Li). In addition, for example, a metal oxide, a metal carbide, and a metal fluoride may be $Re_2O_7$, $MoO_3$, $V_2O_5$, $WO_3$, $TiO_2$, $Cs_2CO_3$, BaF, LiF, or CsF.

In the light emitting device ED according to an embodiment, each of the first stack ST1, the second stack ST2, and the third stack ST3 includes first emission layers BEML-1, BEML-2, and BEML-3 which emit light of the first wavelength. The light of the first wavelength may be light of a blue wavelength range. In an embodiment, the first wavelength may be about 420 nm to about 480 nm. Among the first emission layers BEML-1, BEML-2, BEML-3, the first stack ST1 may include the first-1 emission layer BEML-1, the second stack ST2 may include the first-2 emission layer BEML-2, and the third stack ST3 may include the first-3 emission layer BEML-3. As used herein, the first-1 emission layer BEML-1 means the first emission layer in the first stack ST1, the first-2 emission layer BEML-2 means the first emission layer in the second stack ST2, and the first-3 emission layer BEML-3 means the first emission layer in the first stack ST3. The first-1 emission layer BEML-1, the first-2 emission layer BEML-2, and the first-3 emission layer BEML-3 may each include a host material and a blue light which emits dopant. The dopant included in each of the first-1 emission layer BEML-1, the first-2 emission layer BEML-2, and the first-3 emission layer BEML-3 may be a blue fluorescent dopant. The first-1 emission layer BEML-1, the first-2 emission layer BEML-2, and the first-3 emission layer BEML-3 may each include the same host material and dopant material.

In the light emitting device ED according to an embodiment, the fourth stack ST4 includes a second emission layer GEML which emits light of the second wavelength. The light of the second wavelength may be light of a green wavelength range. In an embodiment, the second wavelength may be about 520 nm to about 600 nm. The second emission layer GEML may include a host material and a green light which emits dopant. The dopant included in the second emission layer GEML may be a green phosphorescent dopant. The host material included in the second emission layer GEML may be the same as or different from the host material included in the first emission layers BEML-1, BEML-2, and BEML-3.

The light emitting device ED of an embodiment has a structure including a plurality of first emission layers BEML-1, BEML-2, and BEML-3, and the second emission layer GEML, and thus use light emission at a plurality of resonance distances, thereby maximizing luminous efficiency. In particular, in the light emitting device ED shown in FIG. 5A, in order to maximize efficiency in a fourth resonance region of the first light having a wavelength of about 420 nm to about 480 nm, the second emission layer GEML which emits second light having a wavelength of about 520 nm to about 600 nm is disposed in the fourth stack ST4, thereby maximizing luminous efficiency of the light emitting device ED.

The first stack ST1 may further include the hole transport region HTR transporting holes provided from the first electrode EL1 to the first-1 emission layer BEML-1, and a first intermediate electron transport region transporting electrons generated from the first charge generation layer CGL1 to the first-1 emission layer BEML-1.

The hole transport region HTR may include a hole injection layer HIL disposed on the first electrode EL1, and a hole transport layer HTL disposed on the hole injection layer HIL. The hole transport layer HTL may contact a lower surface of the first-1 emission layer BEML-1. However, the embodiment of the invention is not limited thereto, and the hole transport region HTR may further include a hole-side additional layer disposed on the hole transport layer HTL. The hole-side additional layer may include at least one among a hole buffer layer, a light emitting auxiliary layer, and an electron blocking layer. The hole buffer layer may compensate a resonance distance according to wavelengths of light emitted from an emission layer, and may thus increase luminous efficiency. The electron blocking layer is a layer that serves to prevent electrons from being injected from an electron transport region to a hole transport region HTR.

The first intermediate electron transport region may include a first intermediate electron transport layer METL1 disposed on the first-1 emission layer BEML-1. The first intermediate electron transport layer METL1 may be disposed between the first-1 emission layer BEML-1 and the first charge generation layer CGL1, and may be in contact with each of the first-1 emission layer BEML-1 and the first charge generation layer CGL1. However, the embodiment of the invention is not limited thereto, and the first intermediate electron transport region may further include a first intermediate electron-side additional layer disposed between the first intermediate electron transport layer METL1 and the first-1 emission layer BEML-1. The first intermediate electron-side additional layer may include at least one of an electron buffer layer or a hole blocking layer. In addition, a first intermediate electron injection layer may be disposed between the first intermediate electron transport layer METL1 and the first charge generation layer CGL1.

The second stack ST2 may further include a first intermediate hole transport region MHTR1 transporting holes generated from the first charge generation layer CGL1 to the first-2 emission layer BEML-2, and a second intermediate electron transport region transporting electrons provided from the second charge generation layer CGL2 to the first-2 emission layer BEML-2.

The first intermediate hole transport region MHTR1 may include a first intermediate hole injection layer MHIL1 disposed on the first charge generation layer CGL1, and a first intermediate hole transport layer MHTL1 disposed on the first intermediate hole injection layer MHIL1. The first intermediate hole transport layer MHTL1 may contact a lower surface of the first-2 emission layer BEML-2. However, the embodiment of the invention is not limited thereto, and the first intermediate hole transport region MHTR1 may further include a first intermediate hole-side additional layer disposed on the first intermediate hole transport layer MHTL1. The first intermediate hole-side additional layer may include at least one of a hole buffer layer, a light emitting auxiliary layer, or an electron blocking layer.

The second intermediate electron transport region may include a second intermediate electron transport layer METL2 disposed on the first-2 emission layer BEML-2. The second intermediate electron transport layer METL2 may be disposed between the first-2 emission layer BEML-2 and the second charge generation layer CGL2, and may be in contact with each of the first-2 emission layer BEML-2 and the second charge generation layer CGL2. However, the embodiment of the invention is not limited thereto, and the second intermediate electron transport region may further include a second intermediate electron-side additional layer disposed between the second intermediate electron transport layer METL2 and the first-2 emission layer BEML-2. The second intermediate electron-side additional layer may include at least one of an electron buffer layer or a hole blocking layer. In addition, a second intermediate electron injection layer may be disposed between the second intermediate electron transport layer METL2 and the second charge generation layer CGL2.

The third stack ST3 may further include a second intermediate hole transport region MHTR2 transporting holes generated from the second charge generation layer CGL2 to the first-3 emission layer BEML-3, and a third intermediate electron transport region transporting electrons provided from the third charge generation layer CGL3 to the first-3 emission layer BEML-3.

The second intermediate hole transport region MHTR2 may include a second intermediate hole injection layer MHIL2 disposed on the second charge generation layer CGL2, and a second intermediate hole transport layer MHTL2 disposed on the second intermediate hole injection layer MHIL2. The second intermediate hole transport layer MHTL2 may contact a lower surface of the first-3 emission layer BEML-3. However, the embodiment of the invention is not limited thereto, and the second intermediate hole transport region MHTR2 may further include a second intermediate hole-side additional layer disposed on the second intermediate hole transport layer MHTL2. The second intermediate hole-side additional layer may include at least one of a hole buffer layer, a light emitting auxiliary layer, or an electron blocking layer.

The third intermediate electron transport region may include a third intermediate electron transport layer METL3 disposed on the first-3 emission layer BEML-3. The third intermediate electron transport layer METL3 may be disposed between the first-3 emission layer BEML-3 and the third charge generation layer CGL3, and may be in contact with each of the first-3 emission layer BEML-3 and the third charge generation layer CGL3. However, the embodiment of the invention is not limited thereto, and the third intermediate electron transport region may further include a third intermediate electron-side additional layer disposed between the third intermediate electron transport layer METL3 and the first-3 emission layer BEML-3. The third intermediate electron-side additional layer may include at least one of an electron buffer layer or a hole blocking layer. In addition, a third intermediate electron injection layer may be disposed between the third intermediate electron transport layer METL3 and the third charge generation layer CGL3.

The fourth stack ST4 may further include a third intermediate hole transport region MHTR3 transporting holes generated from the third charge generation layer CGL3 to the second emission layer GEML, and an electron transport region ETR transporting electrons provided from the second electrode EL2 to the second emission layer GEML.

The third intermediate hole transport region MHTR3 may include a third intermediate hole injection layer MHIL3 disposed on the third charge generation layer CGL3, and a third intermediate hole transport layer MHTL3 disposed on the third intermediate hole injection layer MHIL3. The third intermediate hole transport layer MHTL3 may contact a lower surface of the second emission layer GEML. However, the embodiment of the invention is not limited thereto, and the third intermediate hole transport region MHTR3 may further include a third intermediate hole-side additional layer disposed on the third intermediate hole transport layer MHTL3. The third intermediate hole-side additional layer may include at least one of a hole buffer layer, a light emitting auxiliary layer, or an electron blocking layer.

The electron transport region ETR may include an electron transport layer ETL disposed on the second emission layer GEML, and an electron injection layer EIL disposed on the electron transport layer ETL. The electron transport layer ETL may contact the second emission layer GEML. However, the embodiment of the invention is not limited thereto, and the electron transport region ETR may further include an electron-side additional layer disposed between the electron transport layer ETL and the second emission layer GEML. The electron-side additional layer may include at least one of an electron buffer layer or a hole blocking layer.

Referring to FIGS. 5B and 5C, the light emitting devices ED-1 and ED-2 according to an embodiment may include the second emission layer GEML not in the fourth stack ST4 but in other stacks, as compared to the light emitting device ED shown in FIG. 5A. For example, like the light emitting device ED-1 of an embodiment shown in FIG. 5B, the third stack ST3 may include the second emission layer GEML, and the first stack ST1 and the second stack ST2, and the fourth stack ST4 may each include the first emission layers BEML-1, BEML-2, and BEML-3. Alternatively, like the light emitting device ED-2 of an embodiment shown in FIG. 5C, the first stack ST1 may include the second emission layer GEML, and the second stack ST2, the third stack ST3, and the fourth stack ST4 may each include the first emission layers BEML-1, BEML-2, and BEML-3. Although not shown, the second stack ST2 may include the second emission layer GEML, and the first stack ST1, the third stack ST3, and the fourth stack ST4 may each include the first emission layers BEML-1, BEML-2, and BEML-3.

Referring to FIGS. 5A to 5C together, in the light emitting devices ED, ED-1, ED-2, and ED-3 according to an embodiment, the first electrode EL1 has conductivity. The first electrode EL1 may include or be formed of a metal material, a metal alloy or a conductive compound. The first electrode EL1 may be an anode or a cathode. However, the embodiment of the invention is not limited thereto. In addition, the first electrode EL1 may be a pixel electrode.

In the light emitting devices ED-1, ED-2, and ED-3 according to an embodiment, the first electrode EL1 may be a reflective electrode. For example, the first electrode EL1 may include Ag, Mg, Cu, Al, Pt, Pd, Au, Ni, Nd, Ir, Cr, Li, Ca, LiF/Ca, LiF/Al, Mo, Ti, W, In, Zn, and Sn, which have a high reflectance, a compound thereof, or a mixture thereof (e.g., a mixture of Ag and Mg). Alternatively, the first electrode EL1 may have a multilayer structure including a reflective film formed of the above-described materials, and a transparent conductive film formed of indium tin oxide ("ITO"), indium zinc oxide ("IZO"), zinc oxide (ZnO), indium tin zinc oxide ("ITZO"), etc. For example, the first electrode EL1 may have a two-layer structure of ITO/Ag and a three-layer structure of ITO/Ag/ITO, but is not limited thereto. In addition, the embodiment of the invention is not limited thereto, and the first electrode EL1 may include the above-described metal materials, a combination of two or more metal materials selected from the above-described metal materials, or oxides of the above-described metal materials. The thickness of the first electrode EL1 may be about 700 Angstroms (Å) to about 10000 Å. For example, the first electrode EL1 may have a thickness of 1000 Å to about 3000 Å.

In the light emitting devices ED, ED-1, ED-2, and ED-3 according to an embodiment, the hole transport region HTR and the intermediate hole transport regions MHTR1, MHTR2, and MHTR3 may have a single layer formed of a single material, a single layer formed of a plurality of different materials, or a multi-layer structure including a plurality of layers formed of a plurality of different materials.

The hole transport region HTR and the intermediate hole transport regions MHTR1, MHTR2, and MHTR3 may each be formed using various methods such as a vacuum deposition method, a spin coating method, a cast method, a Langmuir-Blodgett ("LB") method, an inkjet printing method, a laser printing method, a laser induced thermal imaging ("LITI") method, etc.

The hole transport region HTR1, and the intermediate hole transport regions MHTR1, MHTR2, and MHTR3 may each include a phthalocyanine compound such as copper phthalocyanine, N,N'-diphenyl-N,N'-bis-[4-(phenyl-m-tolyl-amino)-phenyl]-biphenyl-4,4'-diamine ("DNTPD"), 4,4',4''-[tris(3-methylphenyl)phenylamino]triphenylamine] ("m-MTDATA"), 4,4',4''-tris(N,N-diphenylamino)triphenylamine ("TDATA"), 4,4',4''-tris{N,-(2-naphthyl)-N-phenylamino)-triphenylamine ("2-TNATA"), poly(3,4-ethylenedioxythiophene)/poly(4-styrenesulfonate) ("PEDOT/PSS"), polyaniline/dodecylbenzenesulfonic acid ("PANI/DBSA"), poly aniline/camphor sulfonic acid ("PANI/CSA"), polyaniline/poly(4-styrenesulfonate) ("PANI/PSS"), N,N'-di(naphthalene-1-yl)-N,N'-diphenyl-benzidine ("NPB"), triphenylamine-containing polyetherketone ("TPAPEK"), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile ("HAT-CN"), etc.

The hole transport region HTR, and the intermediate hole transport region MHTR1, MHTR2, and MHTR3 may each include carbazole-based derivatives such as N-phenyl carbazole and polyvinyl carbazole, fluorene-based derivatives, N,N'-bis(3-methylphenyl)-N,N-diphenyl-[1,1-biphenyl]-4, 4'-diamine ("TPD"), triphenylamine-based derivatives such as 4,4',4''-tris(N-carbazolyl)triphenylamine ("TCTA"), N,N'-di(1-naphtalene-1-yl)-N,N'-diphenyl-benzidine (NPB), 4,4'-cyclohexylidene bis[N,N-bis(4-methylphenyl] benzenamine] ("TAPC"), 4,4'-bis[N,N'-(3-tolyl)amino]-3, 3'-dimethylbiphenyl ("HMTPD"), 1,3-bis(N-carbazolyl) benzene ("mCP"), etc.

In addition, the hole transport region HTR, and the intermediate hole transport region MHTR1, MHTR2, and MHTR3 may include 9-(4-tert-Butylphenyl)-3,6-bis(triphenylsilyl)-9H-carbazole (CzSi), 9-phenyl-9H-3,9'-bicarbazole ("CCP"), 1,3-bis(1,8-dimethyl-9H-carbazol-9-yl)benzene ("mDCP"), etc.

The hole transport region HTR may include the compounds of the hole transport region described above in at least one of the hole injection layer HIL, the hole transport layer HTL, or the hole-side additional layer. The intermediate hole transport regions MHTR1, MHTR2, and MHTR3 may include the compounds of the hole transport region described above in at least one among the intermediate hole injection layer MHIL1, MHIL2, and MHIL3, the intermediate hole transport layer MHTL1, MHTL2, and MHTL3, and the intermediate hole-side additional layer.

The hole transport region HTR, and the intermediate hole transport region MHTR1, MHTR2, and MHTR3 may have a thickness of about 100 Å to about 10000 Å, for example, about 100 Å to about 5000 Å. The hole injection layer HIL, and the intermediate hole injection layer MHIL1, MHIL2, and MHIL3 may each have a thickness of, for example, about 50 Å to about 1000 Å. The hole transport layer HTL, and the intermediate hole transport layer MHTL1, MHTL2, and MHTL3 may each have a thickness of, for example, about 50 Å to about 1000 Å. When the hole transport region HTR includes the hole-side additional layer, the hole-side additional layer may have a thickness of about 10 Å to about 1000 Å. When the intermediate hole transport regions MHTR1, MHTR2, and MHTR3 include the intermediate hole-side additional layer, the intermediate hole-side additional layer may have a thickness of about 10 Å to about 1000 Å. When the hole transport region HTR, and the intermediate hole transport region MHTR1, MHTR2, and MHTR3, and the thicknesses of each layer included therein satisfy the above-described range, satisfactory hole transport properties may be obtained without a substantial increase in driving voltage.

The hole transport region HTR, and the intermediate hole transport region MHTR1, MHTR2, and MHTR3 may each further include, in addition to the above-described materials, a charge generation material to increase conductivity. The charge generation material may be uniformly or non-uniformly dispersed in the hole transport region HTR, and the intermediate hole transport region MHTR1, MHTR2, and MHTR3. The charge generation material may be, for example, a p-type dopant. The p-type dopant may include at least one of halogenated metal compounds, quinone derivatives, metal oxides, or cyano group-containing compounds, but is not limited thereto. For example, the p-type dopant may include halogenated metal compounds such as CuI and RbI, quinone derivatives such as tetracyanoquinodimethane ("TCNQ") and 2,3,5,6-tetrafluoro-7,7,8,8-tetracyanoquinodimethane (F4-TCNQ), metal oxides such as tungsten oxides and molybdenum oxides, etc., but is not limited thereto.

The first emission layers BEML-1, BEML-2, and BEML-3 and the second emission layer GEML are provided on the hole transport region HTR or the intermediate hole transport regions MHTR1, MHTR2, and MHTR3. The first-1 emission layer BEML-1 is provided on the hole transport region HTR, the first-2 emission layer BEML-2 is provided on the first intermediate hole transport region MHTR1, the first-3 emission layer BEML-3 is provided on the second intermediate hole transport region MHTR2, and the second emission layer GEML is provided on the third intermediate hole transport region MHTR3.

The first emission layers BEML-1, BEML-2, and BEML-3, and the second emission layer GEML each have a thickness of, for example, about 100 Å to about 2000 Å, more specifically, about 100 Å to about 1000 Å. The first emission layers BEML-1, BEML-2, and BEML-3, and the second emission layer GEML may each have a single layer formed of a single material, a single layer formed of a plurality of different materials, or a multi-layer structure including a plurality of layers formed of a plurality of different materials.

The first emission layers BEML-1, BEML-2, and BEML-3, and the second emission layer GEML include a host material and a dopant material. The first emission layers BEML-1, BEML-2, BEML-3, and the second emission layer GEML may include a material containing a carbazole derivative moiety or an amine derivative moiety as a hole transporting host material. The first emission layers BEML-1, BEML-2, and BEML-3, and the second emission layer GEML may include a material having a nitrogen-containing aromatic ring structure such as pyridine derivative moiety, pyridazine derivative moiety, pyrimidine derivative moiety, pyrazine derivative moiety, and triazine derivative moiety.

The first emission layers BEML-1, BEML-2, and BEML-3, and the second emission layer GEML may include, as a host material, an anthracene derivative, a pyrene derivative, a fluoranthene derivative, a chrysene derivative, a dihydrobenzanthracene derivative, or a triphenylene derivative. In addition, the first emission layers BEML-1, BEML-2, and BEML-3 may further include a general material known in the art as a host material. For example, the first emission layers BEML-1, BEML-2, and BEML-3, and the second emission layer GEML may include, as a host material, at least one among bis[2-(diphenylphosphino)phenyl] ether oxide ("DPEPO"), 4,4'-bis(N-carbazolyl)-1,1'-biphenyl ("CBP"), 1,3-bis(carbazolyl-9-yl)benzene (mCP), 2,8-bis(diphenylphosphoryl)dibenzofuran ("PPF"), 4,4',4''-tris(carbazol-9-yl)-triphenylamine ("TCTA"), and 1,3,5-tris(1-phenyl-1H-benzo[d]imidazol-2-yl) benzene ("TPBi"). However, the embodiment of the invention is not limited thereto, and for example, tris(8-hydroxyquinolino)aluminum ($Alq_3$), poly(N-vinylcarbazole) ("PVK"), 9,10-di(naphthalene-2-yl)anthracene ("ADN"), 3-tert-butyl-9,10-di(naphth-2-yl)anthracene ("TBADN"), distyrylarylene ("DSA"), 4,4'-bis(9-carbazolyl)-2,2'-dimethyl-biphenyl ("CDBP"), 2-methyl-9,10-bis(naphthalen-2-yl)anthracene ("MADN"), hexaphenyl cyclotriphosphazene ("CP1"), 1,4-bis(triphenylsilyl)benzene ("UGH2"), hexaphenylcyclotrisiloxane ($DPSiO_3$), octaphenylcyclotetrasiloxane ($DPSiO_4$), etc. may be used as a host material.

In an embodiment, the first emission layers BEML-1, BEML-2, and BEML-3 may include, as a known fluorescent dopant material, styryl derivatives (e.g., 1,4-bis[2-(3-N-ethylcarbazoryl)vinyl]benzene (BCzVB), 4-(di-p-tolylamino)-4''-[(di-p-tolylamino)styryl]stilbene ("DPAVB"), and N-(4-((E)-2-(6-((E)-4-(diphenylamino)styryl)naphthalen-2-yl)vinyl)phenyl)-N-phenylbenzenamine ("N-BDAVBi")), perylene and derivatives thereof (e.g., 2,5,8,11-tetra-t-butylperylene ("TBP")), pyrene and derivatives thereof (e.g., 1,1-dipyrene, 1,4-dipyrenylbenzene, 1,4-bis(N,N-diphenylamino)pyrene), etc.

In an embodiment, the second emission layer GEML may include, as a known phosphorescent dopant material, a metal complex including iridium (Ir), platinum (Pt), osmium (Os), gold (Au), titanium (Ti), zirconium (Zr), hafnium (Hf), europium (Eu), and terbium (Tb), or thulium (Tm). To be specific, in the second emission layer GEML, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), platinum octaethyl porphyrin (PtOEP), etc. may be used as a phosphorescent dopant. The second emission layer GEML may include a phosphorescent dopant material emitting green light.

The electron transport region ETR and the intermediate electron transport region may each be disposed on the first emission layers BEML-1, BEML-2, and BEML-3, and the second emission layer GEML. The electron transport region ETR and the intermediate electron transport region may each have a single layer formed of a single material, a single layer formed of a plurality of different materials, or a multi-layer structure including a plurality of layers formed of a plurality of different materials.

The electron transport region ETR and the intermediate electron transport region may each be formed using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR and the intermediate electron transport region may each include an anthracene-based compound. However, the embodiment of the invention is not limited thereto, and the electron transport region ETR and the intermediate electron transport region may each include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine ("T2T"), 2-(4-(N-phenylbenzoimidazolyl-1-ylphenyl)-9,10-dinaphthylanthracene, 1,3,5-tri(1-phenyl-1H-benzo[d]imidazol-2-yl)benzene ("TPBi"), 2,9-dimethyl-4,7-diphenyl-1,10-phenanthroline ("BCP"), 4,7-diphenyl-1,10-phenanthroline (Bphen), 3-(4-biphenylyl)-4-phenyl-5-tert-butylphenyl-1,2,4-triazole ("TAZ"), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate) ($Bebq_2$), 9,10-di(naphthalene-2-yl)anthracene (ADN), 1,3-bis[3,5-di(pyridin-3-yl)phenyl]benzene (BmPyPhB), or a mixture thereof.

In addition, the electron transport region ETR and the intermediate electron transport region may each include halogenated metals such as LiF, NaCl, CsF, RbCl, RbI, CuI, and KI, lanthanide metals such as Yb, co-deposition materials of a halogenated metal and a lanthanide metal. For example, the electron transport region ETR and the intermediate electron transport region may include KI:Yb, RbI:Yb, etc. as a co-deposition material. For the electron transport region ETR and the intermediate electron transport region, a metal oxide such as $Li_2O$ and BaO, or 8-hydroxyl-lithium quinolate (Liq), etc. may be used, but the embodiment of the invention is limited thereto. The electron transport region ETR and the intermediate electron transport region may each also be formed of a mixture material of an electron transport material and an insulating organo-metal salt. The organo-metal salt may be a material having an energy band gap of about 4 eV or greater. Specifically, the organo-metal salt may include, for example, metal acetates, metal benzoates, metal acetoacetates, metal acetylacetonates, or metal stearates.

In addition to the materials described above, the electron transport region ETR and the intermediate electron transport region may each include, for example, at least one of 2,9-dimethyl-4,7-diphenyl-1,10-phenanthroline (BCP) or 4,7-diphenyl-1,10-phenanthroline (Bphen), but the embodiment of the invention is not limited thereto.

The electron transport region ETR may include the above-described compounds of the electron transport region in the electron injection layer EIL or the electron transport layer ETL. When the electron transport region ETR includes the electron-side additional layer, the materials described above may be included in the electron-side additional layer. The intermediate electron transport region may include the above-described compounds of the electron transport region in the intermediate electron transport layers METL1, METL2, and METL3. The intermediate electron transport region may include the above-described electron transport region compounds in the intermediate electron-side additional layer or the intermediate electron injection layer.

The electron transport region ETR and the intermediate electron transport region may each have a thickness of, for example, about 1000 Å to about 1500 Å. The electron transport layer ETL may have a thickness of about 1 Å to about 1000 Å, for example, about 3 Å to about 500 Å. When the thickness of the electron transport layer ETL satisfies the above-described range, satisfactory electron transport properties may be obtained without a substantial increase in driving voltage. The electron transport layer ETL may have a thickness of about 1 Å to about 100 Å, for example, about 3 Å to about 90 Å. When the thickness of the electron injection layer EIL satisfies the above-described ranges, satisfactory electron injection properties may be obtained without a substantial increase in driving voltage. The intermediate electron transport layer METL1, METL2, and METL3 included in the intermediate electron transport region may have a thickness of about 1 Å to about 1000 Å, for example, about 1 Å to about 500 Å.

The second electrode EL2 is provided on the electron transport region ETR. The second electrode EL2 may be a common electrode. The second electrode EL2 may be a cathode or an anode but the embodiment of the invention is not limited thereto. For example, when the first electrode EL1 is an anode, the second electrode EL2 may be a cathode, and when the first electrode EL1 is a cathode, the second electrode EL2 may be an anode.

The second electrode EL2 may be a transflective electrode, or a transmissive electrode. When the second electrode EL2 is a transmissive electrode, the second electrode EL2 may include or be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, a compound thereof, or a mixture thereof (e.g., AgMg, AgYb, or MgAg). Alternatively, the second electrode EL2 may have a multi-layer structure including a reflective film or a transflective film formed of the above-described materials, and a transparent conductive film including or formed of indium tin oxide (ITO), indium zinc oxide (IZO), zinc oxide (ZnO), indium tin zinc oxide (ITZO), etc. For example, the second electrode EL2 may include the above-described metal materials, a combination of two or more metal materials selected from the above-described metal materials, or oxides of the above-described metal materials.

Although not shown, the second electrode EL2 may be connected with an auxiliary electrode. When the second electrode EL2 is connected with the auxiliary electrode, the resistance of the second electrode EL2 may decrease.

A capping layer CPL may be further disposed on the second electrode EL2 of the light emitting devices ED, ED-1, and ED-2 of an embodiment. The capping layer CPL may include a multilayer or a single layer.

In an embodiment, the capping layer CPL may be an organic layer or an inorganic layer. For example, when the capping layer CPL includes an inorganic material, the inorganic material may include an alkali metal compound such as LiF, an alkaline earth metal compound such as $MgF_2$, SiON, $SiN_x$, SiOy, etc.

In an embodiment, for example, when the capping layer CPL includes an organic material, the organic material may include α-NPD, NPB, TPD, m-MTDATA, $Alq_3$ CuPc, N4,N4,N4',N4'-tetra(biphenyl-4-yl) biphenyl-4,4'-diamine (TPD15), 4,4',4"-tris(carbazol sol-9-yl)triphenylamine (TCTA), etc., or may include epoxy resins or acrylates such as methacrylates. However, the embodiment of the invention is not limited thereto, and the capping layer CPL may include compounds P1 to P5 below.

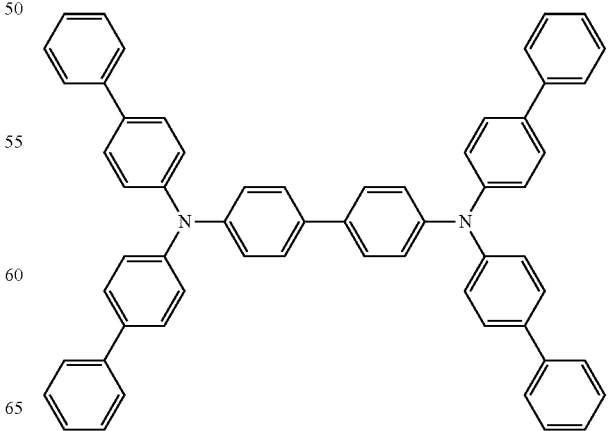

P1

P2

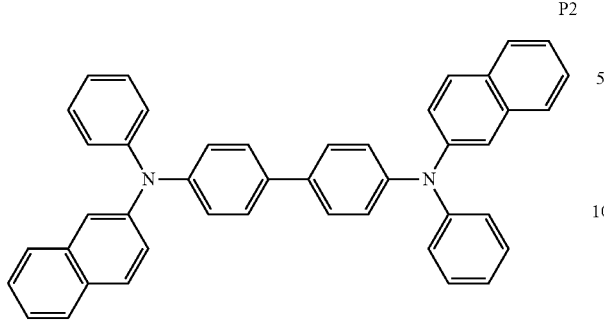

P3

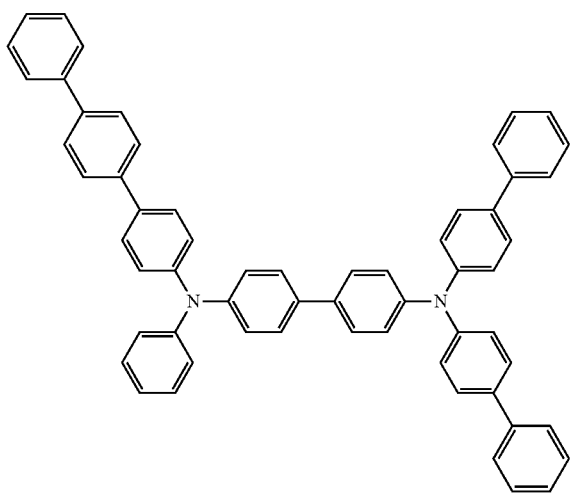

P4

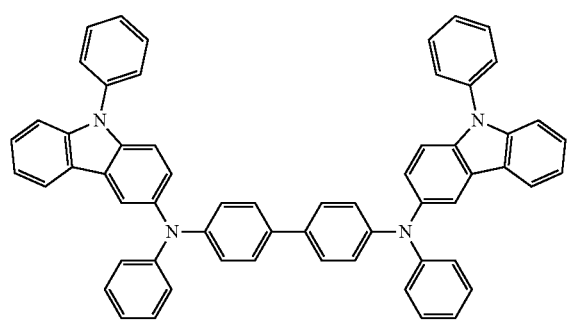

P5

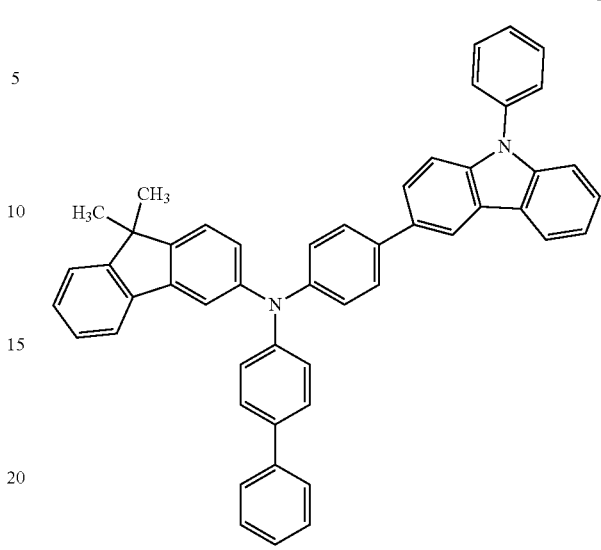

The capping layer CPL may have a refractive index of about 1.6 or greater. To be specific, the capping layer CPL may have a refractive index of about 1.6 or greater in a wavelength of about 550 nm to about 660 nm.

In the light emitting devices ED, ED-1, and ED-2 of an embodiment, the distance from an upper surface of the first electrode EL1 to a lower surface of the second electrode EL2 in the third direction DR3 may be defined as an optical distance OD. The optical distance OD may be a distance at which light generated from the light emitting devices ED, ED-1, and ED-2 is reflected from reflective interfaces to generate resonance. The reflective interfaces are defined as the upper surface of the first electrode EL1 and the lower surface of the second electrode EL2, and accordingly, the distance from the upper surface of the first electrode EL1 to the lower surface of the second electrode EL2 may be defined as the optical distance OD.

In the light emitting devices ED, ED-1, and ED-2 of an embodiment, the optical distance OD may be determined by a range in which exit light emitted from the light emitting devices ED, ED-1, and ED-2 has a maximum intensity at an azimuth angle of about 25 degrees)(° to about 35°. In an embodiment, the optical distance OD may be about 4200 Å to about 4350 Å. The optical distance OD may be about 4250 Å to about 4300 Å. Preferably, the optical distance OD may be about 4275 Å. As the optical distance OD is selected to be in a range of about 4200 Å to about 4350 Å, in the light emitting devices ED, ED-1, and ED-2 of an embodiment, the exit light emitted to the upper portion of the capping layer CPL may have a maximum intensity at an azimuth angle of about 25° to about 35°.

Figure 6:
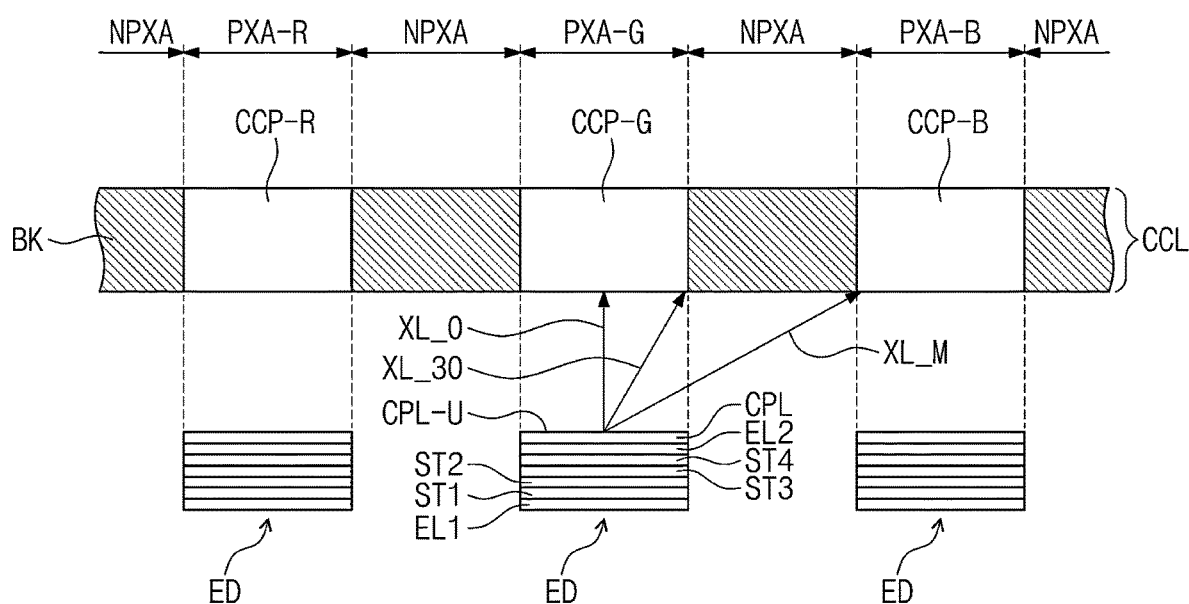
FIG. 6 is a cross-sectional view of some components of a display module according to an embodiment of the invention.

FIG. 6 is a cross-sectional view showing some components of a display module according to an embodiment of the invention. FIG. 6 schematically shows some components of configurations shown in FIG. 4A.

Referring to FIGS. 5A to 5C together with FIG. 6, exit light XL_0, XL_30, and XL_M emitted from the light emitting device ED of an embodiment may have a maximum intensity at an azimuth angle of about 25° to about 35°. Here, the exit light XL_0 is an exit light emitted from the light emitting device ED with an azimuth angle of 0°, the exit light XL_30 is an exit light emitted from the light emitting device ED with an azimuth angle of 30°, the high-angle azimuth exit light XL_M is an exit light emitted from the light emitting device ED with an azimuth angle larger than 35°, and the azimuth angle is defined as an angle between the exit light and a surface plane of the light emitting device ED which is defined by the first direction DR1 and the second direction DR2. The azimuth angles of the exit light XL_0, XL_30, and XL_M may be azimuth angles of the light emitted from the upper surface CPL-U of the capping layer CPL. The exit light XL_0, XL_30, and XL_M may have a maximum intensity at an azimuth angle of 30°. That is, the exit light XL_30 emitted at an azimuth angle of 30° may have a greater intensity than light emitted at other azimuth angles.

The intensity of the exit light XL_0, XL_30, and XL_M at an azimuth angle of 30° may be greater than or equal to an intensity at an azimuth angle of 0°. The intensity of the exit light at an azimuth angle of 30° may be about 1.0 to about 1.2 times the intensity of the exit light at an azimuth angle of 0°. That is, the exit light XL_30 emitted at an azimuth angle of 30° may have an intensity of about 1.0 to about 1.2 times greater than intensity of the exit light XL_0 emitted at an azimuth angle of 0°. The intensity of the exit light at an azimuth angle of 30° may be about 1.11 times the intensity at an azimuth angle of 0°. As the optical distance OD is selected to be in a range of about 4200 Å to about 4350 Å described above, in the light emitting devices ED, ED-1, and ED-2 of an embodiment, the intensity of the exit light at an azimuth angle of 30° emitted from the upper surface CPL-U of the capping layer CPL is about 1.0 to about 1.2 times the intensity at the azimuth angle 0°.

For the exit light emitted from the light emitting device ED of an embodiment, the color coordinate CIEx_30 of the exit light at an azimuth angle of 30° may be about 0.210 to about 0.230, and the color coordinate CIEy_30 at an azimuth angle of 30° is about 0.200 to about 0.230. The color coordinate CIEx_30 of the exit light at an azimuth angle of 30° may be about 0.226 to about 0.230. The color coordinate CIEy_30 of the exit light at an azimuth angle of 30° may be about 0.220 to about 0.230. At an azimuth angle of 30° of the exit light, the color coordinate CIEx_30 may be about 0.228, and the color coordinate CIEy_30 may be about 0.228.

For the exit light emitted from the light emitting device ED of an embodiment, the color coordinate CIEx_0 of the exit light at an azimuth angle of 0° may be about 0.215 to about 0.235, and the color coordinate CIEy_0 at an azimuth angle of 0° is about 0.185 to about 0.205. The color coordinate CIEx_0 of the exit light at an azimuth angle of 0° may be about 0.226 to about 0.235. The color coordinate CIEy_0 of the exit light at an azimuth angle of 0° may be about 0.190 to about 0.200. At an azimuth angle of 0° of the exit light, the color coordinate CIEx_0 may be about 0.232, and the color coordinate CIEy_0 may be about 0.193.

For the exit light emitted from the light emitting device ED of an embodiment, a change rate Au'v' of color coordinates at an azimuth angle of 0° and an azimuth angle of 60° may be about 0.140 to about 0.160. The change rate Au'v' of the color coordinates may be calculated through color coordinates at an azimuth angle of 0° and an azimuth angle of 60°. To be more specific, the change rate Au'v' of the color coordinates may be calculated through Equation 1 below.

$$\Delta u'v' = [(u'_0 - u'_{60})^2 + (v'_0 - v'_{60})^2]^{0.5} \quad \text{[Equation 1]}$$

In Equation 1, u' may be calculated through Equation 2 below, and v' may be calculated through Equation 3 below.

$$u' = 4x/(-2x + 12y + 3) \quad \text{[Equation 2]}$$

$$v' = 9y/(-2x + 12y + 3) \quad \text{[Equation 3]}$$

In Equation 1, $u'_0$ is a u' value at an azimuth angle of 0° calculated through Equation 2, $u'_{60}$ is a u' value at an azimuth angle of 60° calculated through Equation 2, $v'_0$ is a v' value at an azimuth angle of 0° calculated through Equation 3, and $v'_{60}$ is a v' value at an azimuth angle of 60° calculated through Equation 3. In Equations 2 and 3, x represents a value of color coordinate CIEx, and y represents a value of color coordinate CIEy.

In the light emitting device ED of an embodiment, the exit light XL_0, XL_30, and XL_M emitted from the upper surface CPL-U of the capping layer CPL have a maximum intensity at an azimuth angle of about 25° to about 35°, and the display apparatus ES (FIG. 1) including the light emitting device ED may thus have improved display efficiency.

To be more specific, in the light emitting device ED of an embodiment, the exit light XL_30 emitted at an azimuth angle of 30° corresponding to a range of 25° to about 35° may have a greater intensity than light emitted at other azimuth angles. In the light emitting device ED of an embodiment, the intensity of the exit light XL_30 emitted at an azimuth angle of 30° may be greater than the intensity of the exit light XL_0 emitted at an azimuth angle of 0°. In the light emitting device ED of an embodiment, the exit light XL_30 emitted at an azimuth angle of 30° may have a maximum intensity, and as the azimuth angle becomes smaller than 30°, the intensity of the exit light may tend to decrease. The exit light XL_30 emitted at an azimuth angle of 30° has a longer optical path than the exit light XL_0 emitted at an azimuth angle of 0° when the light is incident on the light control unit CCP-R, CCP-B, and CCP-G, and accordingly, the scattering efficiency by scatterers present inside the light control unit CCP-R, CCP-B, and CCP-G is increased, and the light conversion efficiency by light emitting bodies such as quantum dots present inside the light control unit CCP-R, CCP-B, and CCP-G is also increased. Accordingly, the efficiency of white light emitted to the outside through the light control units CCP-R, CCP-B, and CCP-G may be increased, and thus a display apparatus may have improved color reproducibility.

The light emitting device ED of an embodiment may have a maximum intensity in a range of 25° to about 35°, and light emitted at an azimuth angle equal to or greater than the corresponding range may have an intensity less than the maximum intensity. In the light emitting device ED of an embodiment, the exit light XL_30 emitted at an azimuth angle of 30° may have a maximum intensity, and as the azimuth angle becomes larger than 30°, the intensity of the exit light may tend to decrease. In the light emitting device ED, the intensity of the exit light tends to be reduced in the range of greater than 35°, and the intensity of the high-angle azimuth exit light XL_M that may cause different color light emission may be kept low, and accordingly, color mixing may be effectively prevented, resulting in further improvement in color reproducibility of a display apparatus.

Hereinafter, with reference to Examples and Comparative Examples, characteristic evaluation results of a display module including a light emitting device according to an embodiment of the invention will be described. In addition, Examples shown below are illustrated only for the understanding of the invention, and the scope of the invention is not limited thereto.

(Preparation and Evaluation of Display Module)

In Examples and Comparative Examples, a first stack, a second stack, and a third stack including a first emission layer which emits light having a wavelength of about 420 nm to about 480 nm were stacked, and a fourth stack including a second emission layer which emits light having a wavelength of about 520 nm to about 600 nm was stacked on the third stack, thereby obtaining tandem light emitting devices. A capping layer was formed on the second electrode of the tandem light emitting devices. A light control member including a plurality of light control units was formed on the tandem light emitting devices, thereby obtaining a display module.

In Examples and Comparative Examples, the light emitting devices were manufactured to have different optical distances. In Examples the light emitting devices were manufactured to have an optical distance of 4275 Å (d). In Comparative Examples, based on the optical distance d of the light emitting devices in Examples, light emitting devices were manufactured to have optical distances of d−200 Å (4075 Å), d−100 Å (4175 Å), d+100 Å (4375 Å), and d+200 Å (4475 Å).

The evaluation results of the light emitting devices and display apparatuses of Examples and Comparative Examples are shown in Table 1 in FIG. 8 and FIGS. 7A to 7C. Table 1 in FIG. 8 shows ratios at an azimuth angle of 0° and at an azimuth angle of 30°, values of color coordinates CIEx and CIEy ratios at an azimuth angle of 0° and at an azimuth angle of 30°, operation voltage, front luminous efficiency, and sum of intensity for each azimuth of the light emitting devices. Table 1 shows white light efficiency and color reproducibility of the display apparatuses. In the evaluation of the light emitting devices in Table 1, the operation voltage represents a voltage value measured at a current of 10 mA. The operating voltage, the front luminous efficiency, and the sum of the intensity for each azimuth represent relative comparison values with respect to 100% of the operation voltage, the front luminous efficiency, and the sum of the intensity for each azimuth of Comparative Example 1. In the display apparatus evaluation of Table 1, white light efficiency represents a relative comparison value with respect to 100% of the white light efficiency of Comparative Example 1. In the display apparatus evaluation of Table 1, the color reproducibility represents REC2020 standard concordance rates.

Figure 7A:
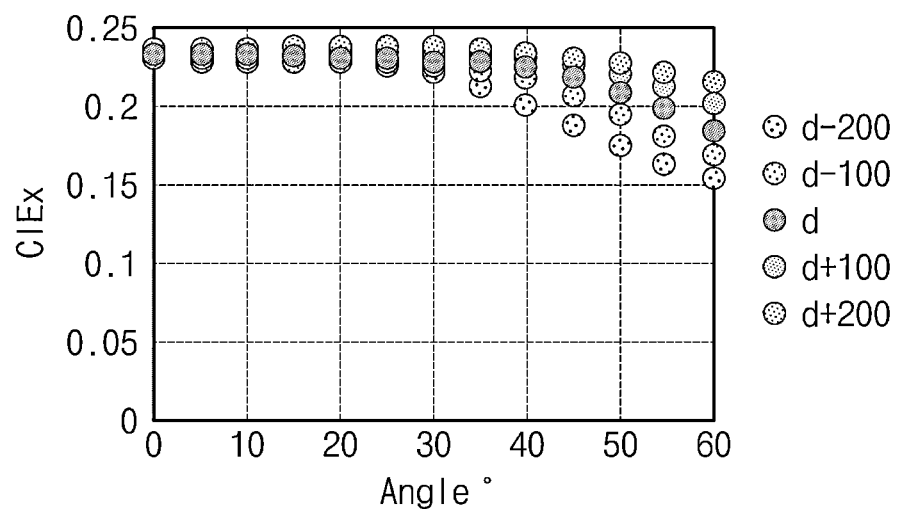
FIG. 7A is a graph showing CIEx color coordinates according to azimuth angles of light emitting devices according to Examples and Comparative Examples.
Figure 7B:
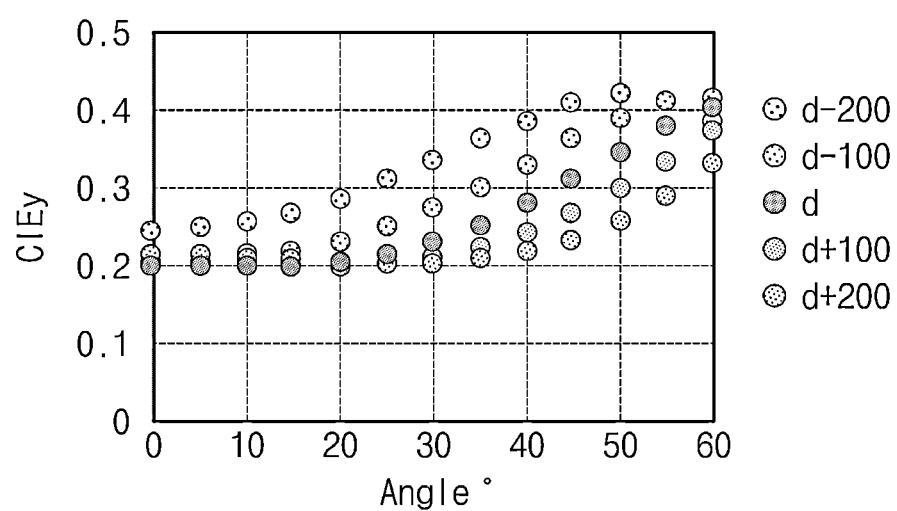
FIG. 7B is a graph showing CIEy color coordinates according to azimuth angles of light emitting devices according to Examples and Comparative Examples.
Figure 7C:
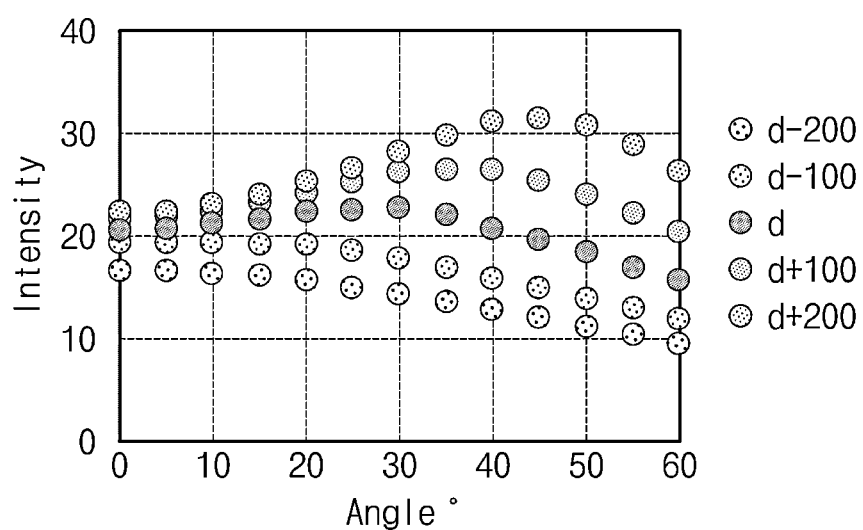
FIG. 7C is a graph showing luminous intensity according to azimuth angles of light emitting devices according to Examples and Comparative Examples.

FIG. 7A is a graph showing CIEx color coordinates according to azimuth angles of light emitting devices according to Examples and Comparative Examples. FIG. 7B is a graph showing CIEy color coordinates according to azimuth angles of light emitting devices according to Examples and Comparative Examples. FIG. 7C is a graph showing luminous intensity according to azimuth angles of light emitting devices according to Examples and Comparative Examples.

Referring to Table 1 in FIG. 8 and the results of FIGS. 7A to 7C, it is confirmed that the light emitting device of an embodiment was manufactured to have an optical distance of 4275 Å, which is the range of an embodiment, and accordingly, has a maximum intensity at an azimuth angle of 25° to 35°, specifically, at an azimuth angle of 30°, the intensity of the light emitting device at an azimuth angle of 30° is 1.11 times the intensity at an azimuth angle of 0°. In addition, it is confirmed that the values of color coordinates CIEx and CIEy at an azimuth angle of 0° and the values of color coordinates CIEx and CIEy at an azimuth angle of 30° correspond to the above-described ranges. It is confirmed that the light emitting device of an embodiment was manufactured to have the optical distance and color coordinates being adjusted within the range of an embodiment, and to have a maximum intensity at an azimuth angle of 30°, and thus have higher white light efficiency and color reproducibility of the display apparatus including the light emitting device than the display apparatus of Comparative Examples.

In Comparative Examples 1 and 2, the front luminous efficiency of the light emitting devices was higher than the front luminous efficiency of the light emitting devices of Examples, but the sum of the intensity for each azimuth is low, and thus, the white light efficiency and color reproducibility of the display apparatuses including the light emitting devices are lower than those of Examples. In Comparative Examples 3 and 4, the front luminous efficiency of the light emitting devices was higher than the front luminous efficiency of the light emitting devices of Examples, but the sum of the intensity for each azimuth is low, and thus, the white light efficiency and color reproducibility of the display apparatuses including the light emitting devices are lower than those of Examples. The comparative data confirms that the display apparatuses including the light emitting devices of Examples have improved white light efficiency and color reproducibility.

According to an embodiment of the invention, luminous intensity for each azimuth of a light emitting device may be optimized to increase light conversion efficiency of a light emitting body included in a light control unit, which may allow a display apparatus to have improved luminous efficiency and color reproducibility when the light emitting device is applied to the display apparatus.

Although the invention has been described with reference to a preferred embodiment of the invention, it will be understood that the invention should not be limited to these preferred embodiments but various changes and modifications can be made by those skilled in the art without departing from the spirit and scope of the invention. Accordingly, the technical scope of the invention is not intended to be limited to the contents set forth in the detailed description of the specification, but is intended to be defined by the appended claims.

What is claimed is:

1. A light emitting device comprising:
a first electrode;
a hole transport region disposed on the first electrode;
a first emission layer disposed on the hole transport region, and which emits light of a first wavelength;
a second emission layer disposed on the hole transport region, and which emits light of a second wavelength different from the first wavelength;
an electron transport region disposed on the first emission layer and the second emission layer;
a second electrode disposed on the electron transport region; and
a capping layer disposed on the second electrode,
wherein an exit light is emitted from an upper surface of the capping layer,
the exit light has a maximum intensity at an azimuth angle of about 25 degrees (°) to about 35°, and
from the light with the maximum intensity among the exit light, the intensity of the exit light gradually decreases as the azimuth angle decreases or increases.

2. The light emitting device of claim 1, wherein the first wavelength is about 420 nanometers (nm) to about 480 nm, and the second wavelength is about 520 nm to about 600 nm.

3. The light emitting device of claim 1, further comprising a first charge generation layer disposed between the first emission layer and the second emission layer.

4. The light emitting device of claim 3, wherein the first charge generation layer comprises:
a first p-type charge generation layer doped with a p-dopant; and
a second n-type charge generation layer doped with an n-dopant.

5. The light emitting device of claim 1, further comprising an additional emission layer disposed between the hole transport region and the electron transport region, and which emits light of the first wavelength.

6. The light emitting device of claim 5, wherein the additional emission layer comprises:
a first additional emission layer disposed between the first emission layer and the second emission layer; and
a second additional emission layer disposed between the first additional emission layer and the second emission layer.

7. The light emitting device of claim 5, wherein the additional emission layer comprises a third additional emission layer disposed between the second electrode and the second emission layer, and which emits light of the first wavelength.

8. The light emitting device of claim 1, wherein the second emission layer is disposed between the first emission layer and the second electrode.

9. The light emitting device of claim 1, wherein:
the hole transport region comprises a hole injection layer disposed on the first electrode, and a hole transport layer disposed on the hole injection layer; and
the electron transport region comprises an electron transport layer disposed on the first emission layer and the second emission layer, and an electron injection layer disposed on the electron transport layer.

10. The light emitting device of claim 1, wherein the capping layer has a refractive index of about 1.6 or greater.

11. The light emitting device of claim 1, wherein:
the first emission layer is a fluorescent emission layer; and
the second emission layer is a phosphorescent emission layer.

12. The light emitting device of claim 1, wherein the intensity of the exit light at an azimuth angle of 30° is about 1.0 to about 1.2 times the intensity of the exit light at an azimuth angle of 0°.

13. The light emitting device of claim 1, wherein color coordinate of the International Commission on Illumination (CIE) x-coordinate of the exit light at an azimuth angle of 30° is about 0.210 to about 0.230, and color coordinate CIE y-coordinate at an azimuth angle of 30° is about 0.200 to about 0.230.

14. The light emitting device of claim 1, wherein color coordinate of the International Commission on Illumination (CIE) x-coordinate of the exit light at an azimuth angle of 0° is about 0.215 to about 0.235, and color coordinate CIE y-coordinate at an azimuth angle of 0° is about 0.185 to about 0.205.

15. The light emitting device of claim 1, further comprising an intermediate electron transport layer disposed on the first emission layer, and
an intermediate hole transport layer disposed on the second emission layer and the first emission layer.

16. The light emitting device of claim 1, wherein a distance from an upper surface of the first electrode to a lower surface of the second electrode is defined as an optical distance, and
the optical distance is about 4200 Angstroms (Å) to about 4350 Å.

17. A light emitting device comprising:
a first electrode;
a hole transport region disposed on the first electrode;
a plurality of first emission layers disposed on the hole transport region, and which emits light of a first wavelength;
a second emission layer disposed on the hole transport region, and which emits light of a second wavelength different from the first wavelength;
an electron transport region disposed on the first emission layer and the second emission layer; and
a second electrode disposed on the electron transport region,
wherein a distance from an upper surface of the first electrode to a lower surface of the second electrode is defined as an optical distance, and
the optical distance is about 4200 Å to about 4350 Å.

18. A display apparatus comprising:
a substrate in which a first pixel area which emits light of a first wavelength, a second pixel area which emits light of a second wavelength different from the first wavelength, and a third pixel area which emits light of a third wavelength different from the first wavelength and the second wavelength are defined; and
a plurality of light emitting devices disposed on the substrate to overlap the first pixel area, the second pixel area, and the third pixel area in a plan view,
wherein the plurality of light emitting devices each include:
a first electrode;
a hole transport region disposed on the first electrode;
a first emission layer disposed on the hole transport region, and which emits light of a first wavelength;
a second emission layer disposed on the hole transport region, and which emits light of a second wavelength different from the first wavelength;
an electron transport region disposed on the first emission layer and the second emission layer;
a second electrode disposed on the electron transport region; and
a capping layer disposed on the second electrode,
wherein an exit light is emitted from an upper surface of the capping layer, the exit light has a maximum intensity at an azimuth angle of about 25° to about 35°, and from the light with the maximum intensity among the exit light, the intensity of the exit light gradually decreases as the azimuth angle decreases or increases.

19. The display apparatus of claim 18, further comprising a light control layer disposed on the plurality of light emitting devices,
wherein the light control layer includes:
a first light control unit which overlaps the first pixel area in the plan view and transmits the light of the first wavelength;
a second light control unit which overlaps the second pixel area in the plan view and transmits the light of the second wavelength; and
a third light control unit which overlaps the third pixel area in the plan view and transmits the light of the third wavelength.

20. The display apparatus of claim 19, wherein:
the second light control unit contains a first quantum dot which converts the exit light into the light of the second wavelength; and
the third light control unit contains a second quantum dot which converts the exit light into the light of the third wavelength.

* * * * *